(12) United States Patent
Bozdog et al.

(10) Patent No.: US 10,707,211 B2
(45) Date of Patent: Jul. 7, 2020

(54) INTEGRATED CIRCUITRY COMPRISING AN ARRAY, METHOD OF FORMING AN ARRAY, METHOD OF FORMING DRAM CIRCUITRY, AND METHOD USED IN THE FABRICATION OF INTEGRATED CIRCUITRY

(71) Applicant: Micron Technology, Inc., Boise, ID (US)

(72) Inventors: Cornel Bozdog, Boise, ID (US); Abhilasha Bhardwaj, Boise, ID (US); Byeung Chul Kim, Boise, ID (US); Michael E. Koltonski, Boise, ID (US); Gurtej S. Sandhu, Boise, ID (US); Matthew Thorum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/139,816

(22) Filed: Sep. 24, 2018

(65) Prior Publication Data
US 2020/0098761 A1    Mar. 26, 2020

(51) Int. Cl.
*H01L 27/108* (2006.01)
*H01L 23/528* (2006.01)
*H01L 23/522* (2006.01)
*H01L 21/822* (2006.01)

(52) U.S. Cl.
CPC .... *H01L 27/10823* (2013.01); *H01L 21/8221* (2013.01); *H01L 23/528* (2013.01); *H01L 23/5226* (2013.01); *H01L 27/1085* (2013.01); *H01L 27/10885* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,268,072 B2* | 9/2007 | Deboer | ............. | H01L 21/76895 257/E21.011 |
| 8,637,993 B2* | 1/2014 | Wong | ................ | H01L 21/76898 257/774 |
| 2004/0140502 A1* | 7/2004 | Murata | ................. | G11C 11/412 257/328 |
| 2005/0101081 A1* | 5/2005 | Goda | ................... | H01L 27/0207 438/222 |
| 2007/0020928 A1* | 1/2007 | Albertson | ......... | H01L 21/76801 438/672 |
| 2010/0311206 A1* | 12/2010 | Bathan | .................. | H01L 21/561 438/107 |
| 2012/0319278 A1* | 12/2012 | Lin | ................... | H01L 21/76885 257/751 |
| 2016/0093583 A1* | 3/2016 | Yu | .......................... | H01L 24/09 257/737 |

OTHER PUBLICATIONS

Farhan Rane, Bravais lattices, pp. 1-11, 2009, Cornell University (Year: 2009).*

* cited by examiner

*Primary Examiner* — Galina G Yushina
(74) *Attorney, Agent, or Firm* — Wells St. John P.S.

(57) ABSTRACT

Integrated circuitry comprising an array comprises a plurality of conductive vias. Individual of the vias comprise an upper horizontal perimeter comprising opposing end portions. One of the opposing end portions comprises opposing straight sidewalls. The other of the opposing end portions comprises opposing curved sidewalls that join with the opposing straight sidewalls of the one opposing end portion. Other embodiments, including methods, are disclosed.

26 Claims, 23 Drawing Sheets

US 10,707,211 B2

INTEGRATED CIRCUITRY COMPRISING AN ARRAY, METHOD OF FORMING AN ARRAY, METHOD OF FORMING DRAM CIRCUITRY, AND METHOD USED IN THE FABRICATION OF INTEGRATED CIRCUITRY

TECHNICAL FIELD

Embodiments disclosed herein pertain to integrated circuitry comprising an array, to methods of forming an array, to methods of forming DRAM circuitry, and to methods used in the fabrication of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry. Regardless, capacitors, transistors, and other integrated circuitry components may connect to lower circuit components through elevationally-extending (e.g., vertical) conductive vias. Such vias may be initially patterned into one lattice pattern that is later transformed (e.g., by a redistribution layer) into another different lattice pattern.

DETAILED DESCRIPTION OF EXAMPLE EMBODIMENTS

Figure 1:
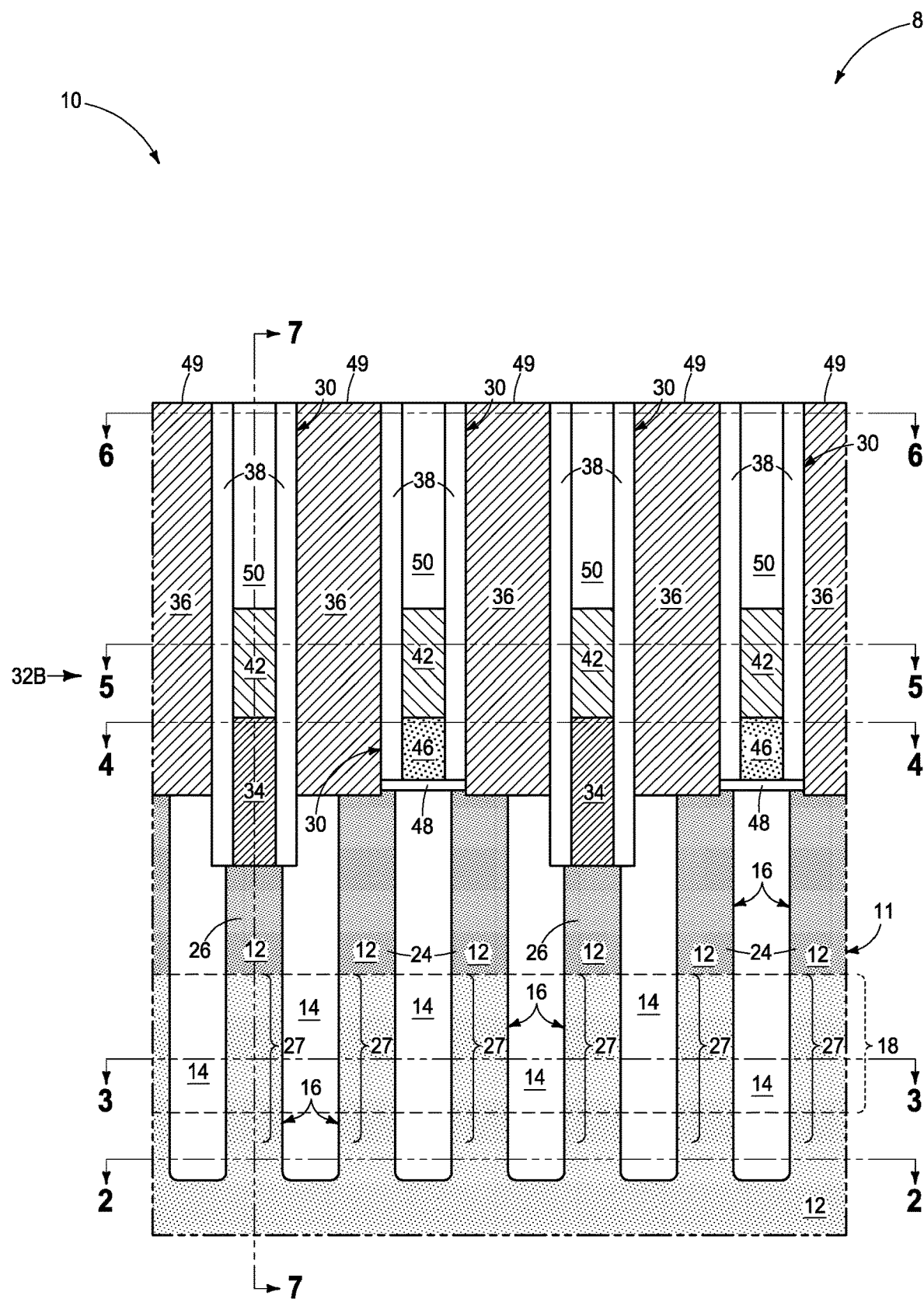
FIG. 1 is a diagrammatic cross-sectional view of a portion of a DRAM construction in process in accordance with some embodiments of the invention and is taken through line 1-1 in FIGS. 1-8.
Figure 2:
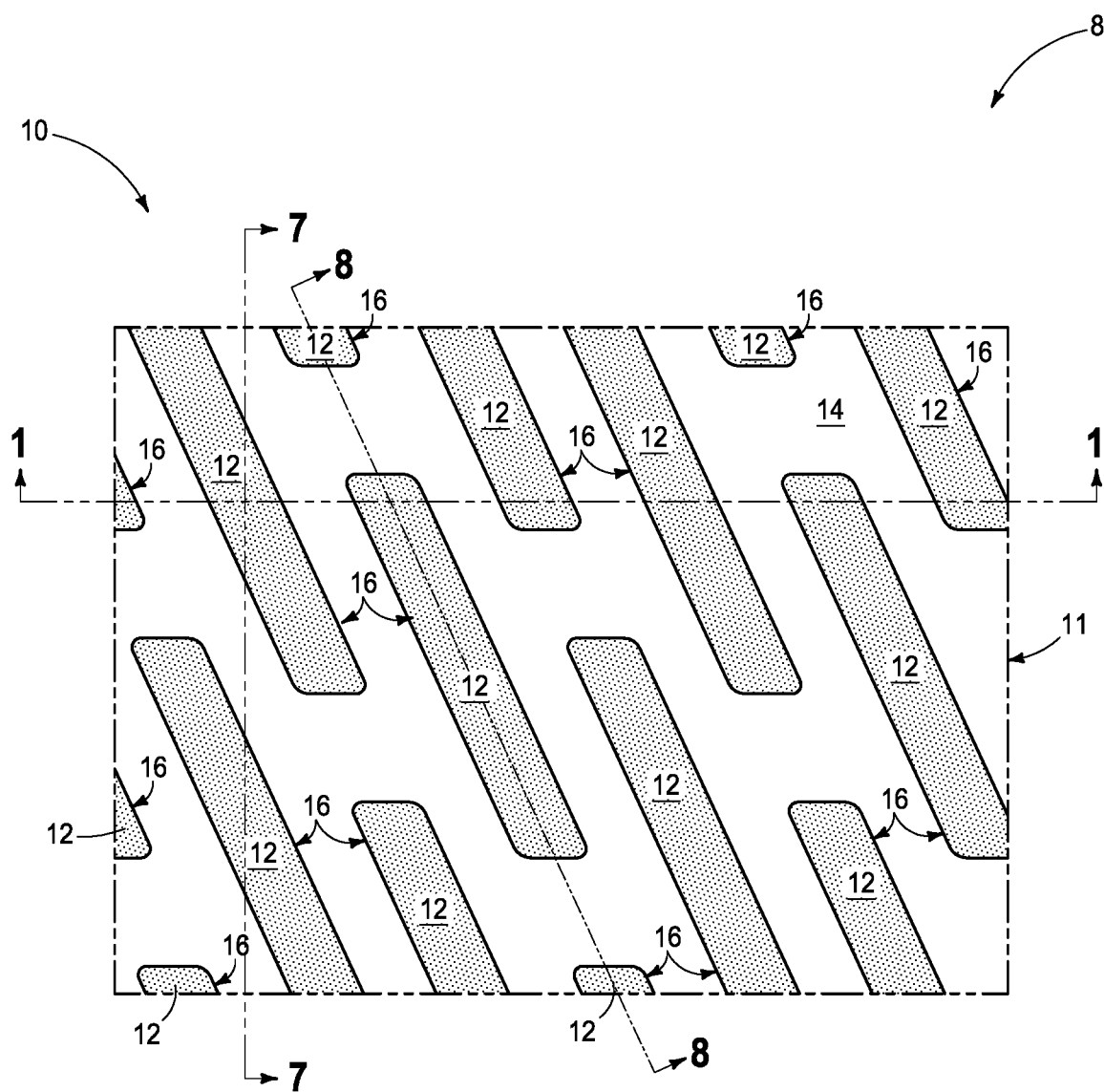
FIG. 2 is a view taken through line 2-2 in FIGS. 1, 7, and 8.
Figure 3:
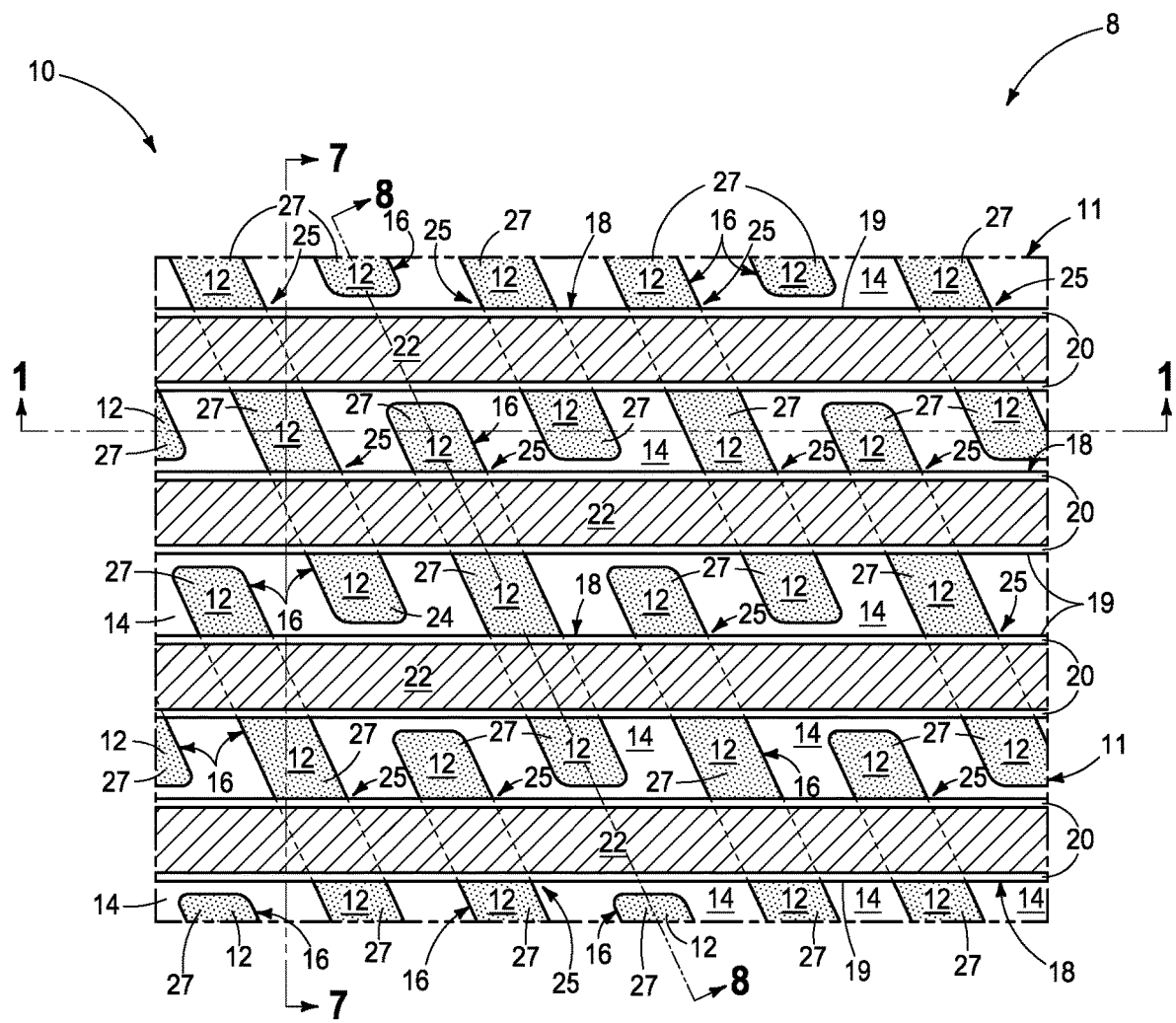
FIG. 3 is a view taken through line 3-3 in FIGS. 1, 7, and 8.
Figure 4:
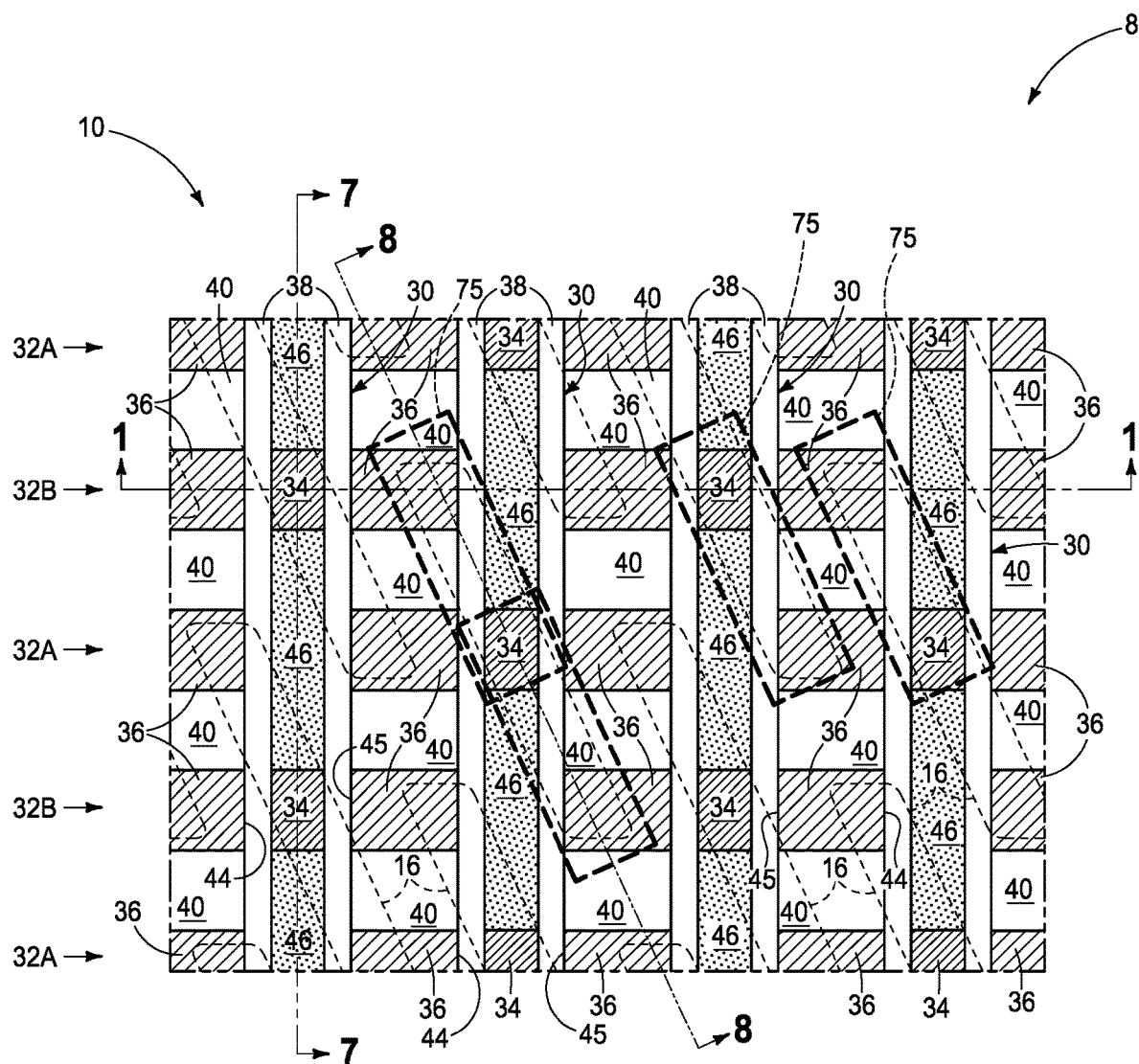
FIG. 4 is a view taken through line 4-4 in FIGS. 1, 7, and 8.
Figure 5:
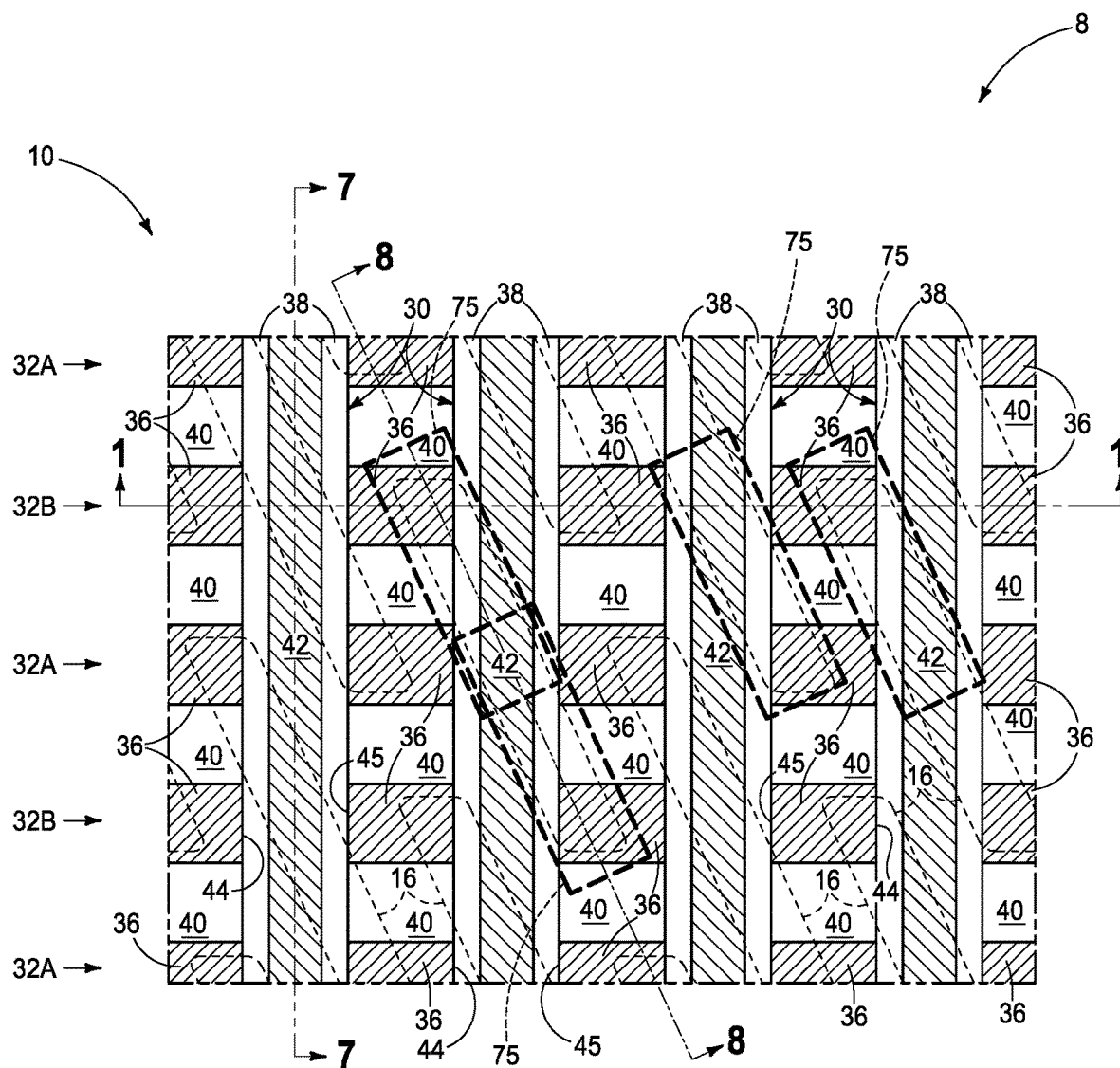
FIG. 5 is a view taken through line 5-5 in FIGS. 1, 7, and 8.
Figure 6:
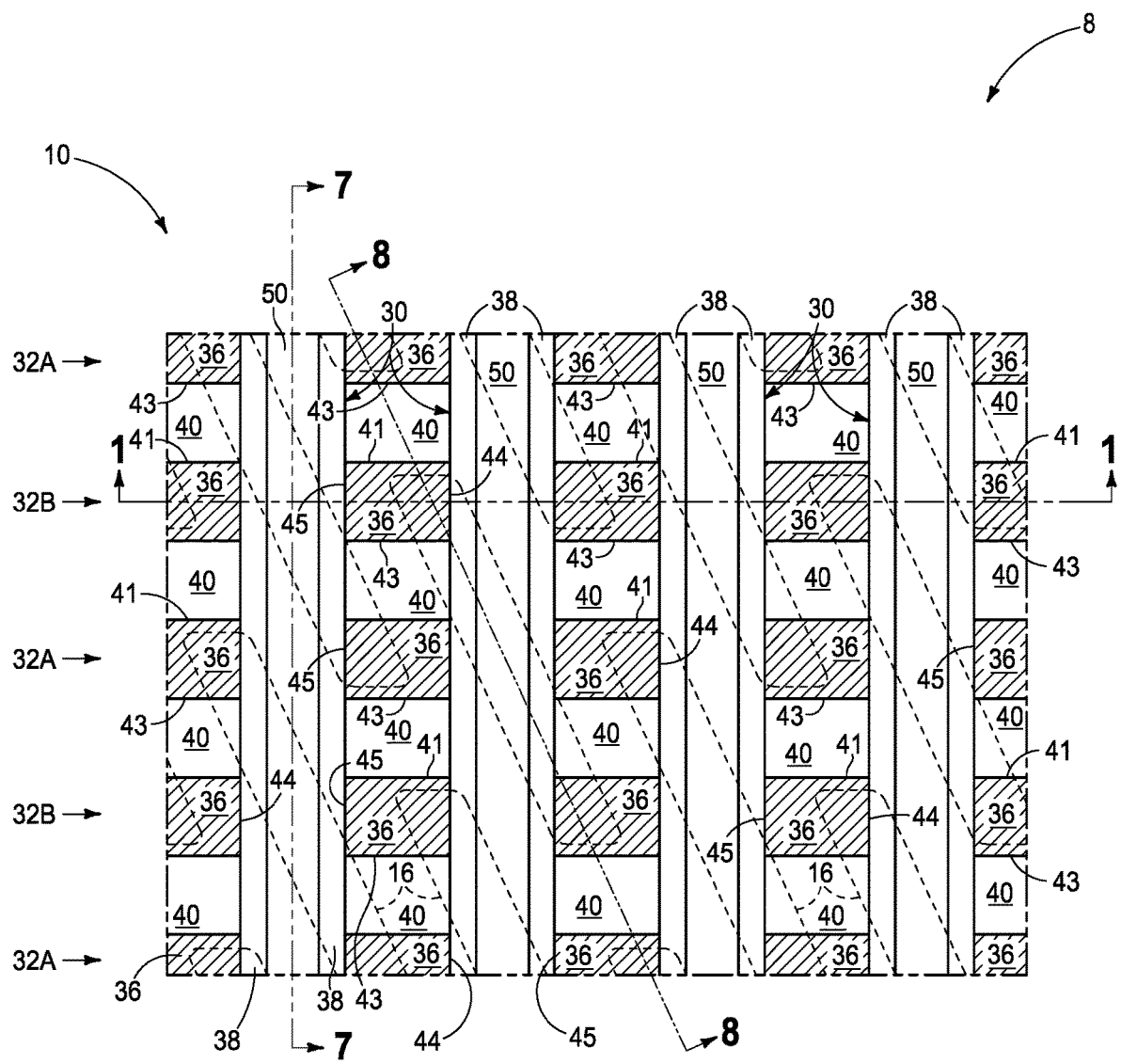
FIG. 6 is a view taken through line 6-6 in FIGS. 1, 7, and 8.
Figure 7:
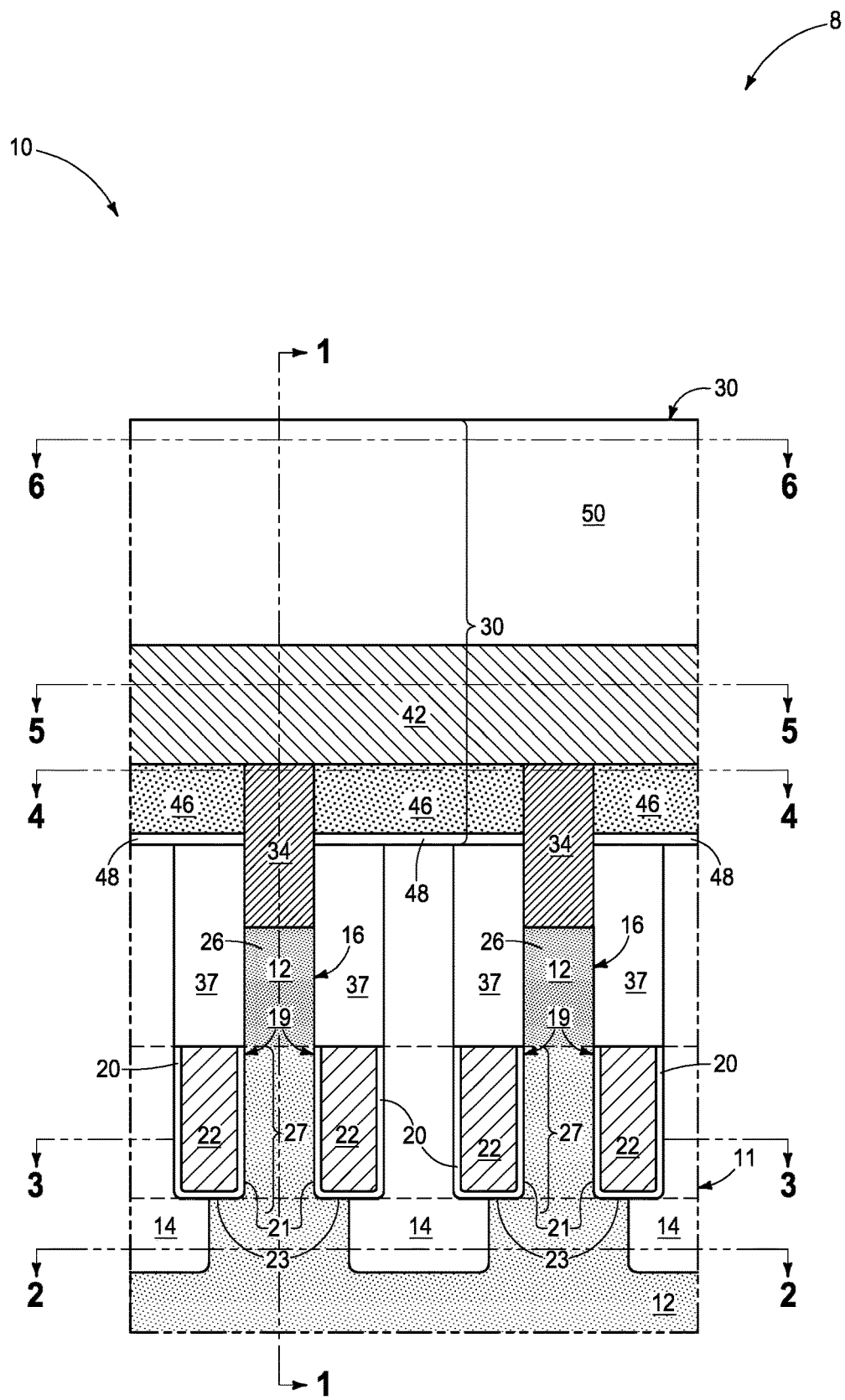
FIG. 7 is a view taken through line 7-7 in FIGS. 1-6.
Figure 8:
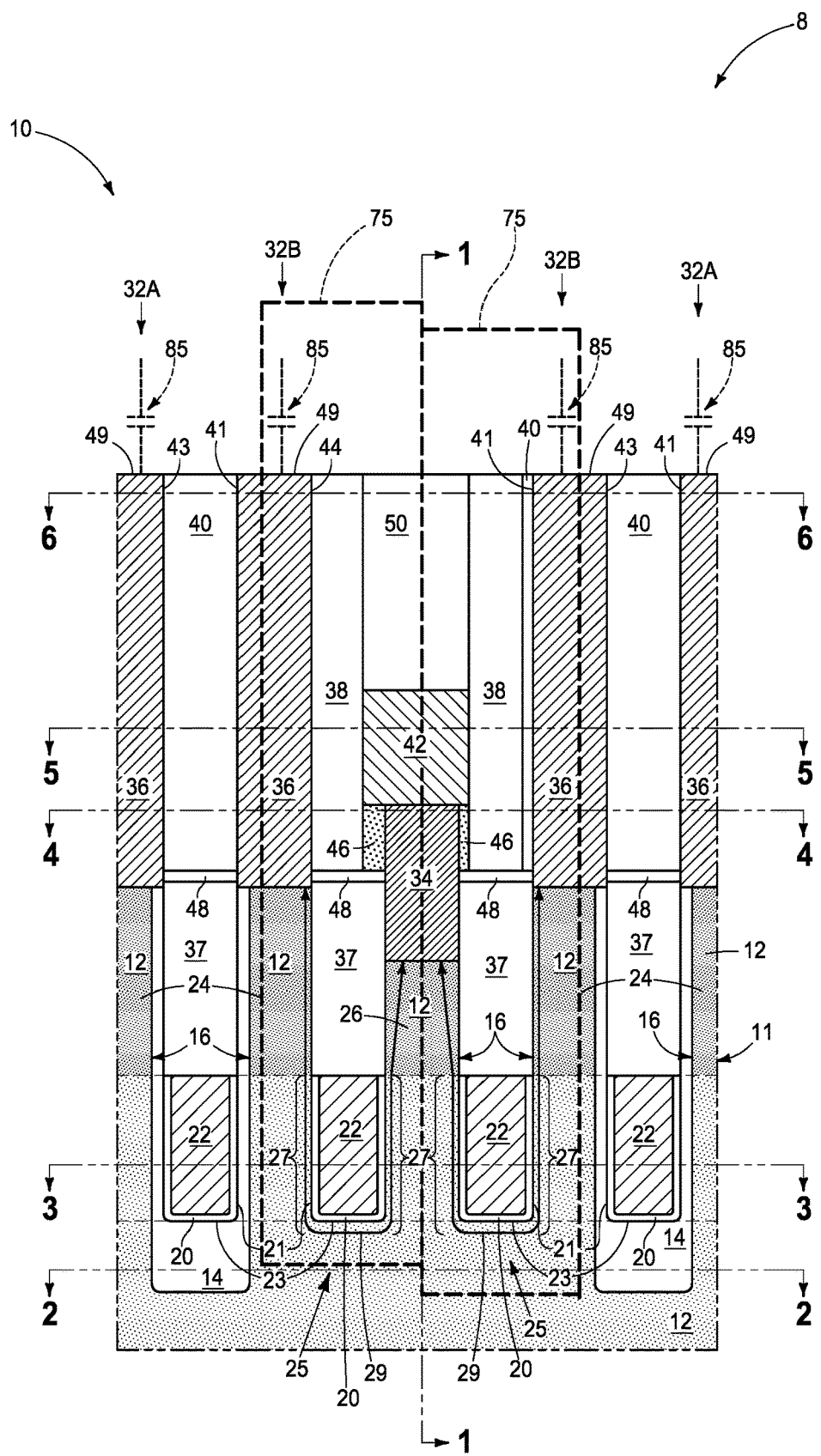
FIG. 8 is a view taken through line 8-8 in FIGS. 2-6.

Embodiments of the invention encompass integrated circuitry comprising an array, a method of forming an array, a method of forming DRAM circuitry, and a method used in the fabrication of integrated circuitry. Example embodiments of a method of forming DRAM circuitry are described initially with reference to FIGS. 1-8. Such show an example fragment of a substrate construction 8 comprising an array or array area 10 that has been fabricated relative to a base substrate 11. Substrate construction 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-8-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 will comprise memory cells occupying space within outlines 75 (only two outlines 75 shown in FIG. 8, and only four outlines 75 shown in FIGS. 4 and 5, for clarity in such figures), for example DRAM memory cells, individually comprising a field effect transistor device 25 (FIGS. 3 and 8) and a charge-storage device (described below). However, embodiments of the invention encompass fabricating of other memory cells and other constructions of integrated circuitry independent of whether containing memory cells.

Field effect transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

A channel region 27 (FIGS. 1, 7, and 8) is in semiconductive material 12 below pair of source/drain regions 24, 26 along trench sidewalls 21 (FIGS. 7 and 8) and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1\times10^{17}$ atoms/cm$^3$. When suitable voltage is applied to gate material 22 of an access line construction 18, a conductive channel forms (e.g., along a channel current-flow line/path 29 [FIG. 8]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

In one embodiment, digitline structures 30 have been formed and that individually directly electrically couple to the one shared source/drain region 26 of multiple of the individual pairs of devices 25. Digitline structures 30 comprise conductive material 42 (e.g., metal material and/or conductively-doped semiconductive material). Elevationally-extending conductive vias 34 (e.g., metal material and/or conductively-doped semiconductive material) are spaced longitudinally along digitline structures 30 and extend downwardly from conductive material 42. Conductive vias 34 individually directly electrically couple digitline structures 30 to individual of shared source/drain regions 26 of the individual pairs of devices 25. Doped or undoped semiconductor material 46 is between immediately-longitudinally-adjacent conductive vias 34. Lower insulative material 48 (e.g., one or more of silicon dioxide, silicon nitride, aluminum dioxide, hafnium oxide, etc.; e.g., thickness of 50 to 200 Angstroms) is below semiconductor material 46 between immediately-longitudinally-adjacent conductive vias 34. As alternate examples, material 46 may comprise insulative material or metal material or be eliminated, with conductive material 42 extending inwardly to lower insulative material 48 (not shown).

A pair of capacitors (e.g., dashed lines designated as 85 in FIG. 8, but not yet fabricated) will individually directly electrically couple to one of the other source/drain regions 24 in the individual pairs of devices 25. Elevationally-extending conductive vias 36 (same or different composition from that of vias 34) have been formed between and laterally between and spaced longitudinally along digitline structures 30. Conductive vias 36 will individually interconnect individual non-shared source/drain regions 24 with individual capacitors 85 as will be described in more detail below, and in one embodiment are elevationally elongated. In one embodiment, conductive vias 36 are chemically homogenous (e.g., and physically homogenous). In another embodiment, conductive vias 36 comprises a lower conductive material (e.g., metal material) and an upper conductive material (e.g., conductively-doped semiconductive material such as conductively-doped polysilicon) that are of different compositions relative one another. In one embodiment, conductive vias 36 predominately comprise (i.e., meaning more than 50% by volume up to and including 100% by volume) polysilicon. Example insulator material 38, 40 and 50 (e.g., silicon nitride and/or silicon dioxide) surrounds vias 34, 36, with insulator materials 38 and 50 comprising part of digitline structures 30.

Conductive vias 36 may be considered as having been formed in rows 32A, 32B (generically referred to as 32*). Rows 32A comprise a first series of rows 32* and rows 32B comprise a second series of rows 32*. Reference to "first" and "second" with respect to different features or materials herein is only for convenience of description in referring to different features or materials. Accordingly, and unless otherwise indicated, "first" and "second" may be interchanged independent of relative position within the finished circuit construction and independent of sequence in fabrication. In one embodiment and as shown, first series of rows 32A individually alternate every-other-one with second series of rows 32B. Other alternations may be used. Individual conductive vias 36 comprise first and second opposing upper (e.g., uppermost) end-walls 44 and 45, respectively and a top 49. Individual conductive vias 36 may be considered as comprising upper (for example uppermost) opposing sidewalls 41 and 43. Individual conductive vias 36 have example upper horizontal perimeters (FIG. 6) that are rectangular, although alternate shapes include square, circular, elliptical, oval, triangular, hexagonal, pentagonal, shapes including a combination of curved segment and straight segment sides, etc. Accordingly, the upper horizontal perimeters of individual conductive vias 36 may be of any shape, and further need not be of the same shape relative one another. Example individual conductive vias 36 as perhaps best perceived by viewing FIGS. 1 and 8 individually have straight-linear and vertical sidewalls. Alternately, by way of example only, sidewalls of individual conductive vias 36 may taper radially inward progressing deeper or higher (e.g., to be conical-like, hourglass-like, etc.) in the depicted construction (not shown) whereby the horizontal perimeters of individual conductive vias 36 are not constant in at least one of shape, size, and linear length from their top to their bottom within an individual conductive via 36. Use of "side" and "end" with respect to "walls" is for distinguishing one pair of opposing walls from another pair of opposing walls regardless of whether the upper horizontal perimeter of the conductive via is of a quadrilateral shape and regardless of whether the upper horizontal perimeter is elongated in any direction.

Figure 9:
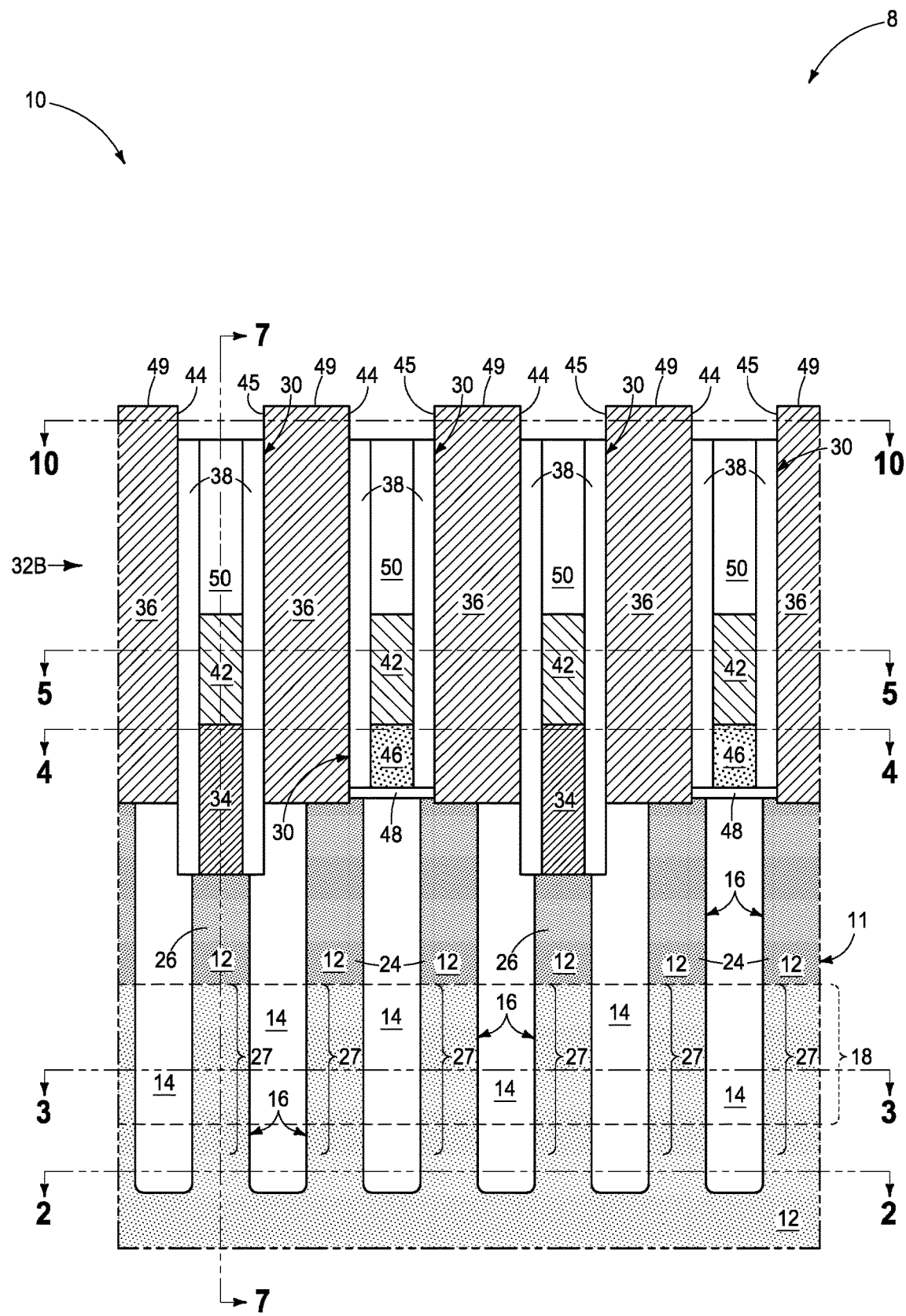
FIG. 9 is a view of the FIG. 1 construction at a processing step subsequent to that shown by FIG. 11 and is taken through line 9-9 in FIG. 10.
Figure 10:
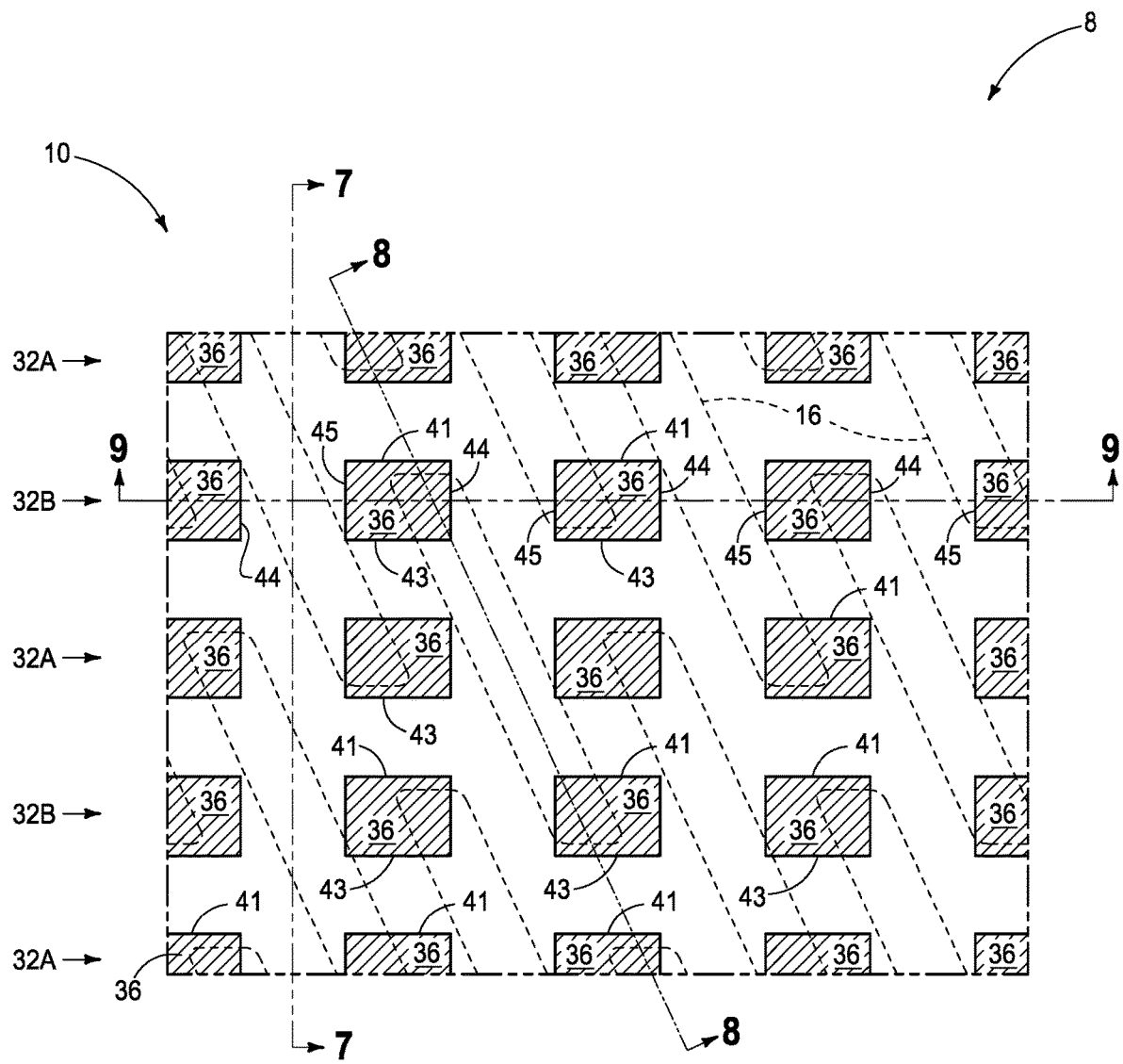
FIG. 10 is a view taken through line 10-10 in FIG. 9.

Referring to FIGS. 9 and 10, materials 38 and 50 have been recessed to expose first and second upper end-walls 44 and 45, respectively. In one embodiment and as is apparent in FIG. 10, material 40 as can be seen in FIGS. 4-6 and 8 has also been recessed to expose opposing sidewalk 41 and 43. Such an act or recessing may occur, for example, by selective etching of materials 38, 50, and 40 relative to conductive material of vias 36. As an alternate example, the end-walls and sidewalls could be formed and effectively exposed by selectively depositing conductive material (e.g., metal material) from tops 49 (not shown).

Figure 11:
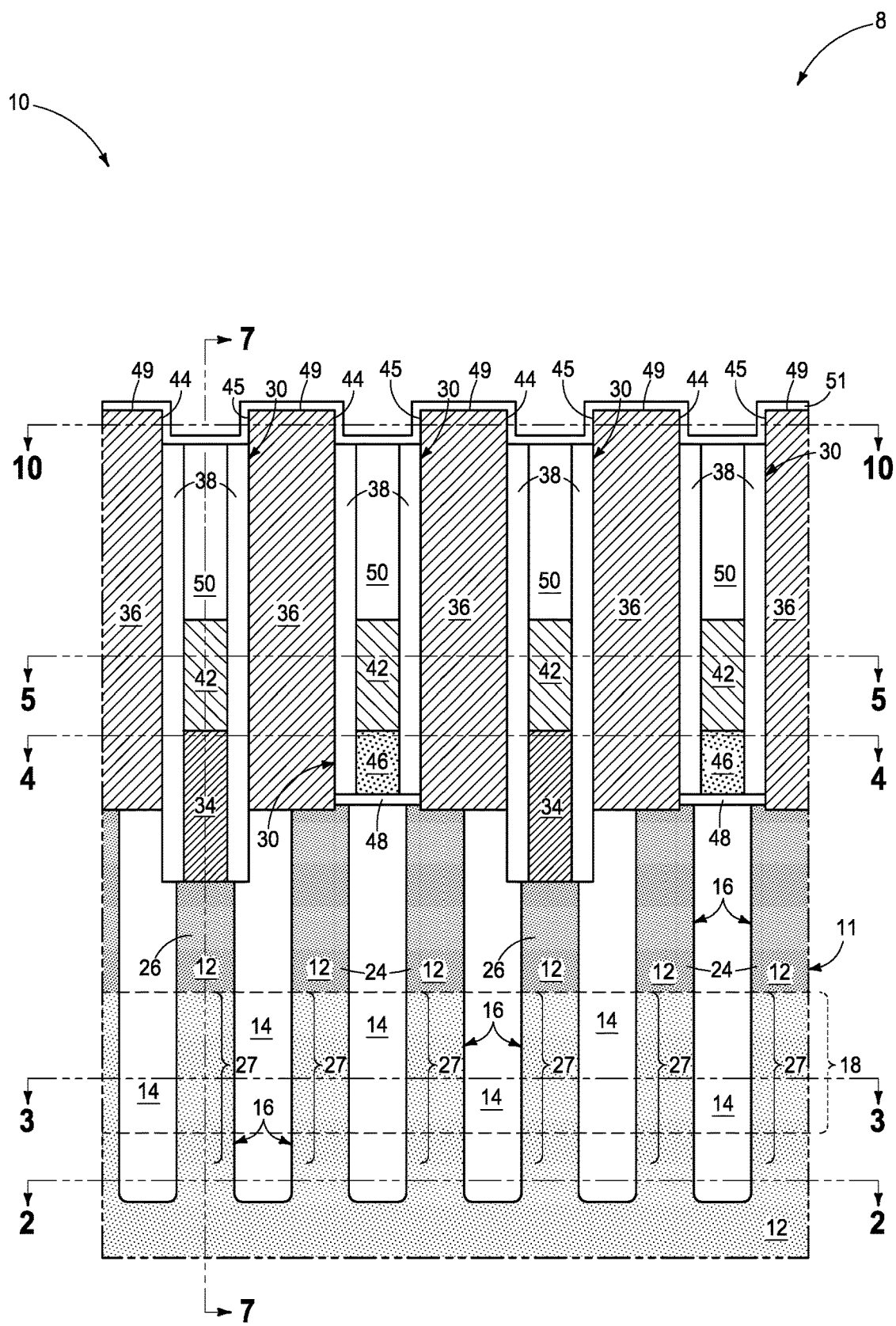
FIG. 11 is a view of the FIG. 9 construction at a processing step subsequent to that shown by FIG. 9 and is taken through line 11-11 in FIG. 12.
Figure 12:
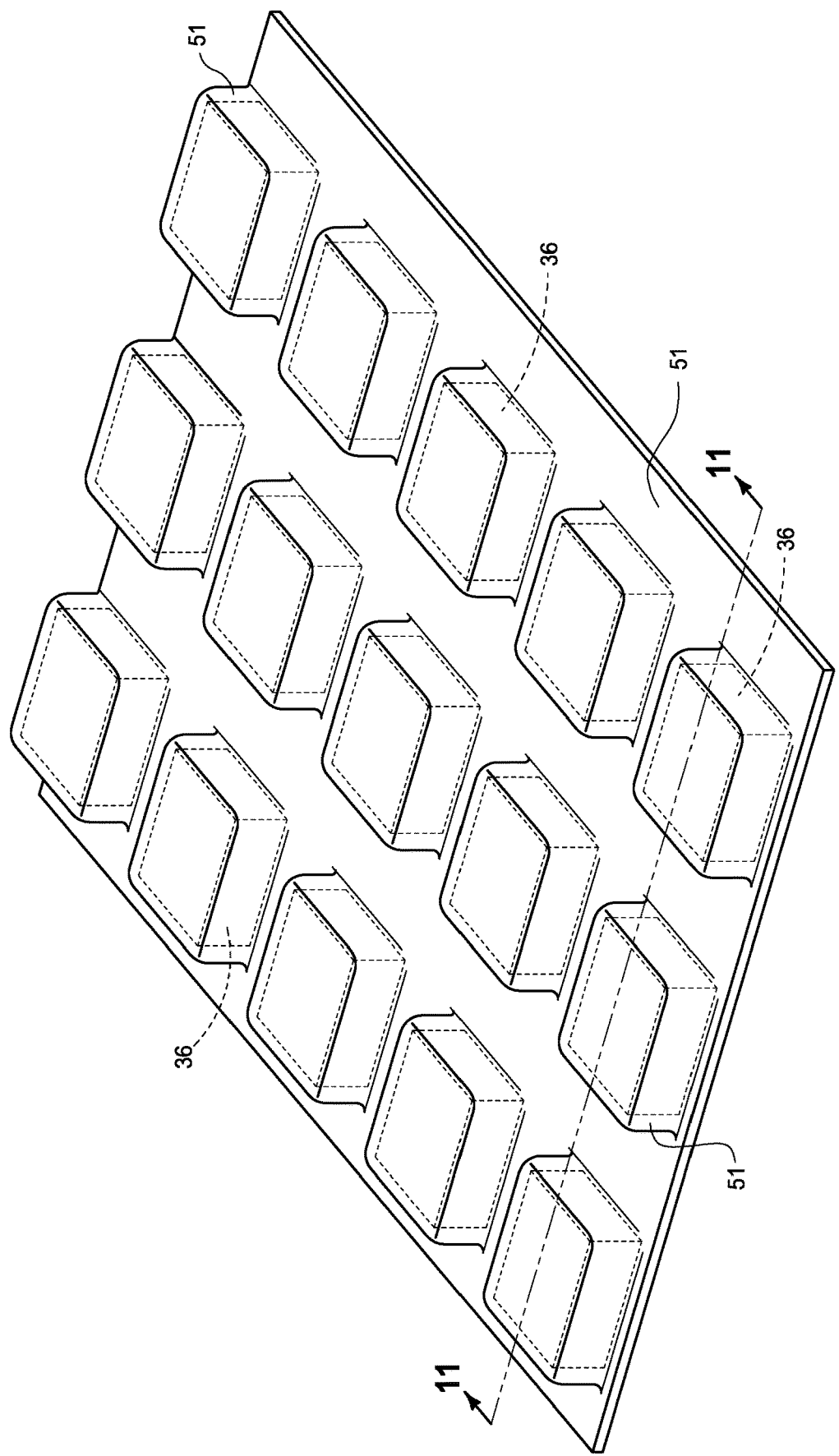
FIG. 12 is a perspective view of a portion of FIG. 11.

Referring to FIGS. 11 and 12, first and second upper end-walls 44 and 45, respectively, have been covered with covering material 51, and in one embodiment as have been opposing sidewalls 41 and 43. Covering material 51 may or may not be 100% sacrificial. In one embodiment and as shown, conductive-via tops 49 have also been covered with covering material 51. Regardless, in one embodiment covering material 51 is insulative (e.g., $Si_xN_y$, such as $Si_3N_4$), in one embodiment is conductive (e.g., Al, Cu), and in one embodiment is semiconductive (e.g., AlN, semiconductively-doped polysilicon). In one embodiment, covering material 51 comprises polysilicon (undoped, doped to be semiconductive, or doped to be conductive).

Figure 13:
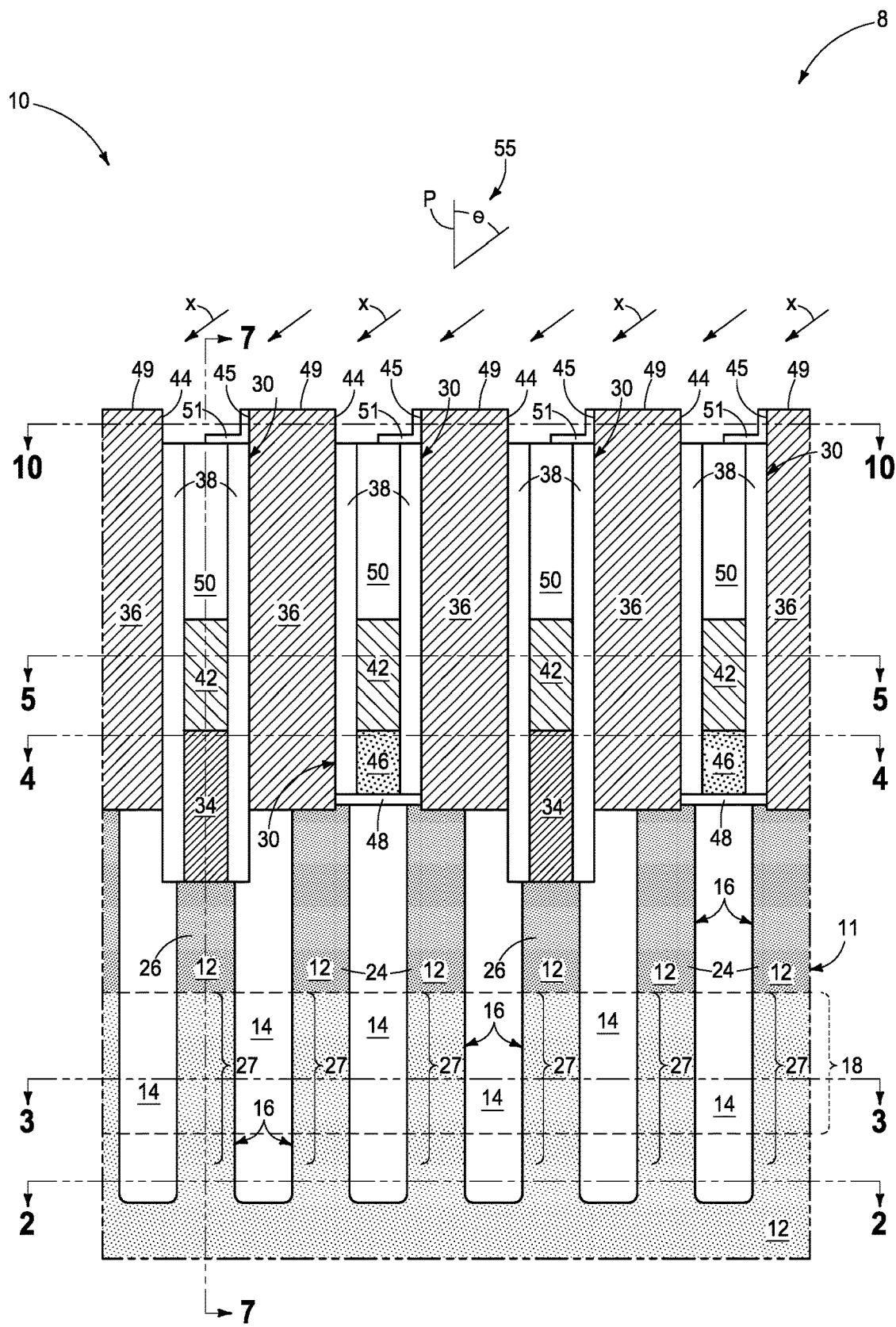
FIG. 13 is a view of the FIG. 11 construction at a processing step subsequent to that shown by FIG. 11 and is taken through line 13-13 in FIG. 14.
Figure 14:
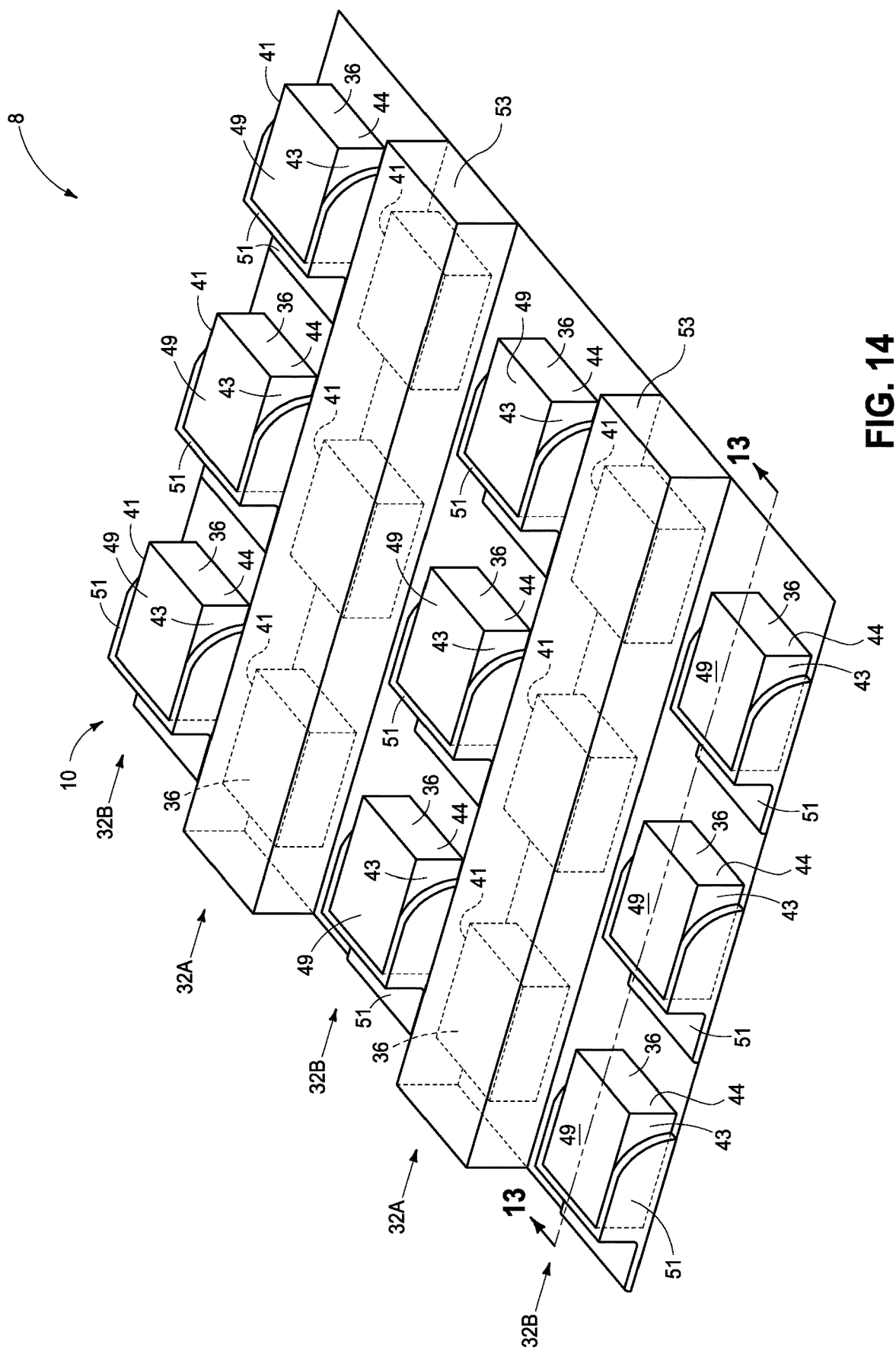
FIG. 14 is a perspective view of a portion of FIG. 13.

Referring to FIGS. 13 and 14, first series of rows 32A have been masked to leave second series of rows 32B unmasked. Such may be conducted, for example, using photolithography and a masking material 53 (e.g., photoresist, hard-masking material(s), antireflective coating(s), etc.) or any other existing or future-developed masking technique(s). Pitch multiplication may be used. Then, covering material 51 has been removed from and to expose first upper end-walls 44 in unmasked second series of rows 32B. An example technique of doing so comprises anisotropically directional etching of covering material 51 that is over first upper end-walls 44 at a first angle Θ (i.e., other than the straight angle) on a first side 55 of perpendicular P to a mean global outer horizontal surface of substrate construction 8. Such angled etching is diagrammatically illustrated with angled straight arrows X. An example technique would be to use a tool capable of angled anisotropic etching (e.g., the Raptor available from Applied Materials of Santa Clara, Calif.) and using any suitable anisotropic etching chemistry (e.g., $CH_2F_2$ and/or $CF_4$ for $Si_3N_4$). In one embodiment and as shown in FIGS. 13 and 14, where covering material 51 was covering tops 49 as shown in FIGS. 11 and 12, such covering material is removed during removing of covering material 51 from first upper end-walls 44 in unmasked second series of rows 32B and thereby also exposing tops 49. Also, as shown in FIGS. 13 and 14, the act of removing covering material 51 may also remove and thereby unmask some of sidewalls 41 and 43, whereby only another some of sidewalls 41 and 43 remains masked after the depicted etching/removing of covering material 51.

Figure 15:
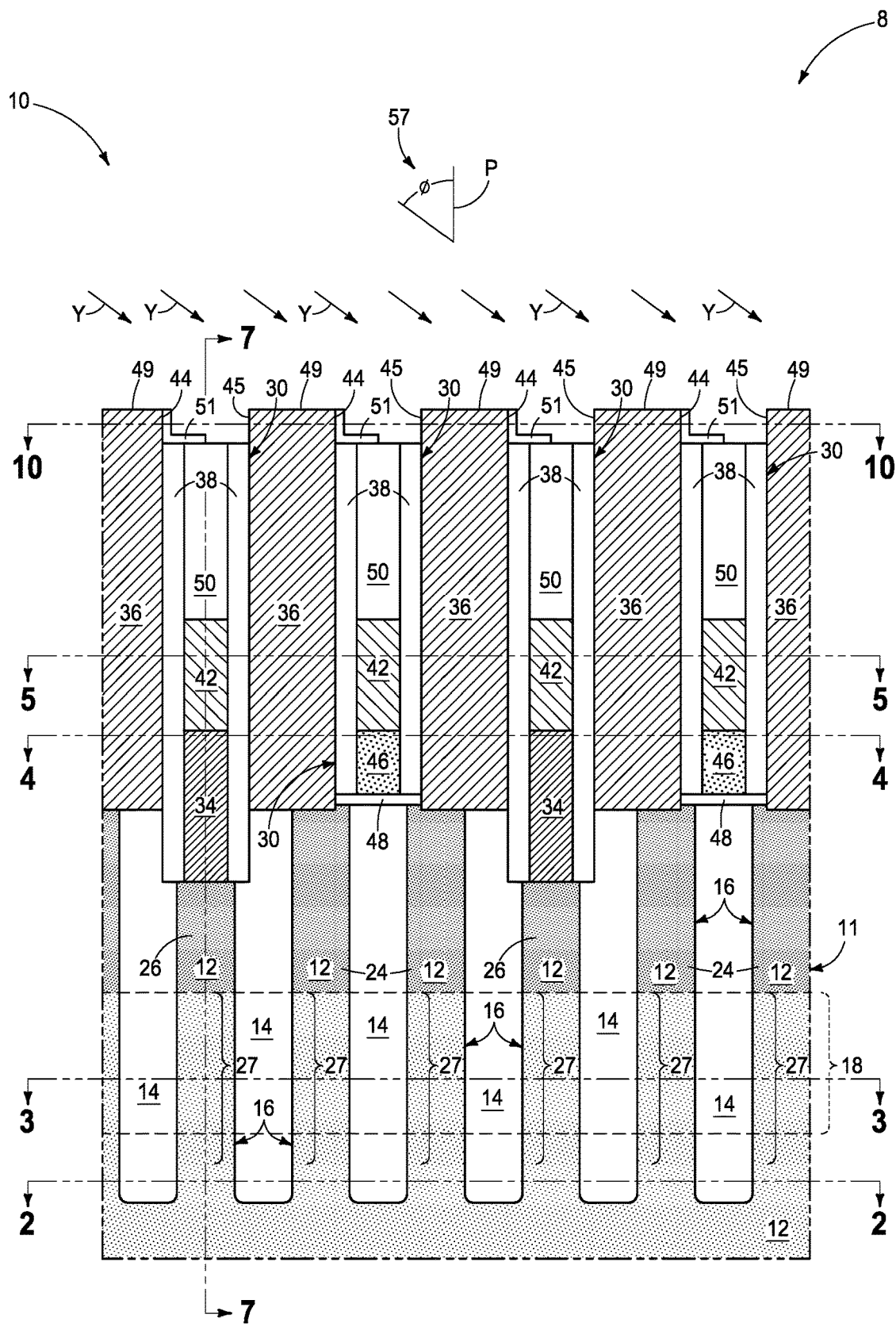
FIG. 15 is a view of the FIG. 13 construction at a processing step subsequent to that shown by FIG. 13 and is taken through line 15-15 in FIG. 16.
Figure 16:
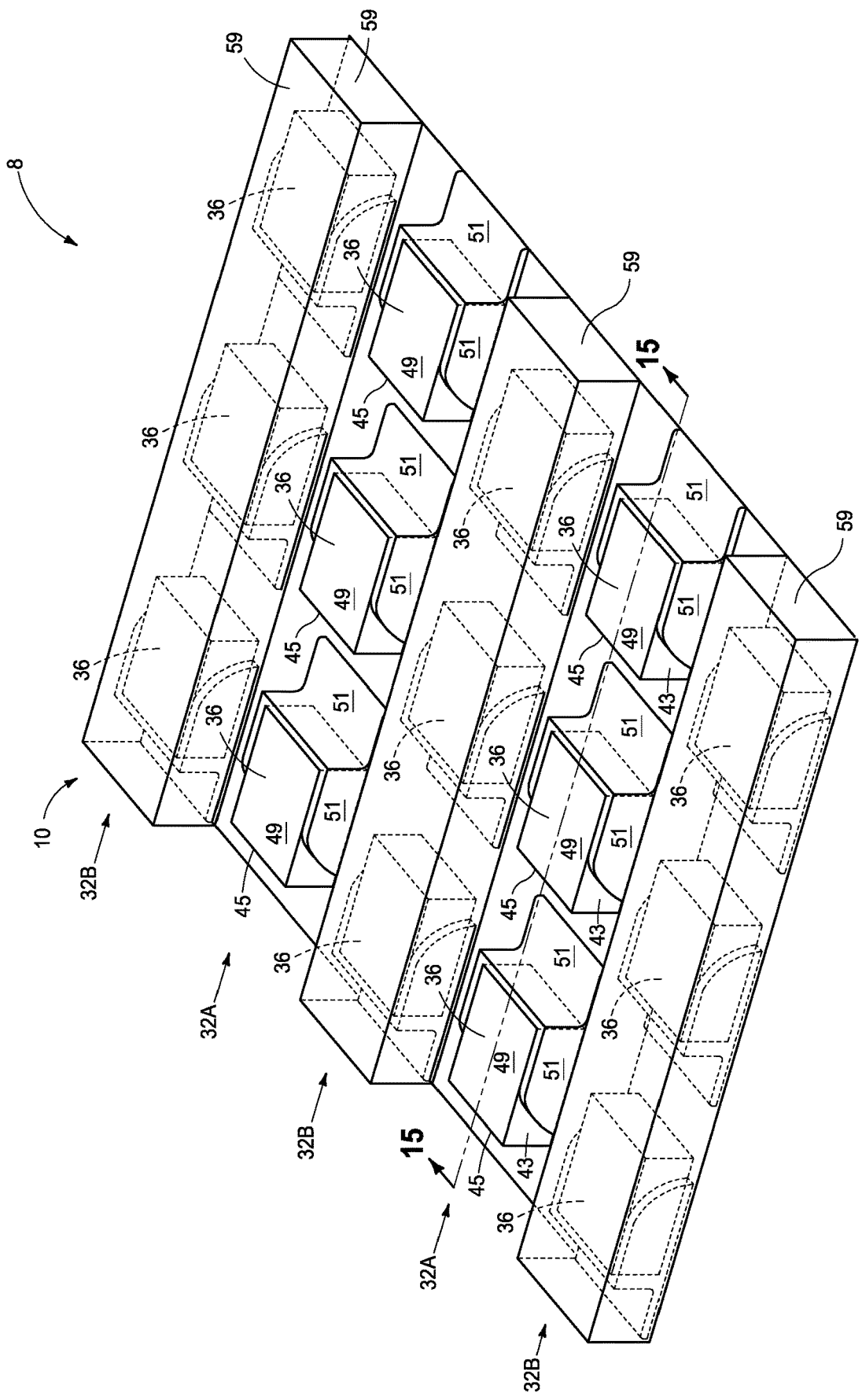
FIG. 16 is a perspective view of a portion of FIG. 15.

Referring to FIGS. 15 and 16, second series of rows 32B have been masked to leave first series of rows 32A unmasked, for example reversing the act of masking shown by FIGS. 13 and 14. Such may occur by, for example, depositing a suitable masking material 59 onto the structure of FIGS. 13 and 14, followed by planarizing such back at least to the elevationally outermost surfaces of masking material 53 (not shown in FIGS. 15 and 16). Then, masking material 53 (not shown) may then be etched away selectively relative to masking material 59, thus reversing and resulting in a construction like that shown in FIGS. 15 and 16. Alternately, by way of example and less-preferred, separate/independent photomasking steps (with or without pitch multiplication) may be used to for the constructions of FIGS. 13/14 and FIGS. 15/16. Then, and regardless, covering material 51 has been removed from and to expose second upper end-walls 45 in unmasked first series of rows 32A. An example technique may be conducted analogously to that described above, namely anisotropically directionally etching of covering material 51 that is over second upper end-walls 45 at a second angle φ (i.e., other than the straight angle) on a second side 57 opposite first side 55 of perpendicular P to the mean global outer horizontal surface of substrate construction 8. Such angled etching is diagrammatically illustrated with angled straight arrows Y. In one embodiment, first and second angles Θ and φ, respectively, are the same (i.e., in magnitude) but for being relative to different first and second sides 55 and 57, respectively. Also, and as referred to above, the act of removing covering material 51 may also remove and thereby unmask some of sidewalls 41 and 43, whereby only another some of sidewalls 41 and 43 remains masked after the depicted etching/removing of covering material 51 in FIGS. 15 and 16.

Figure 17:
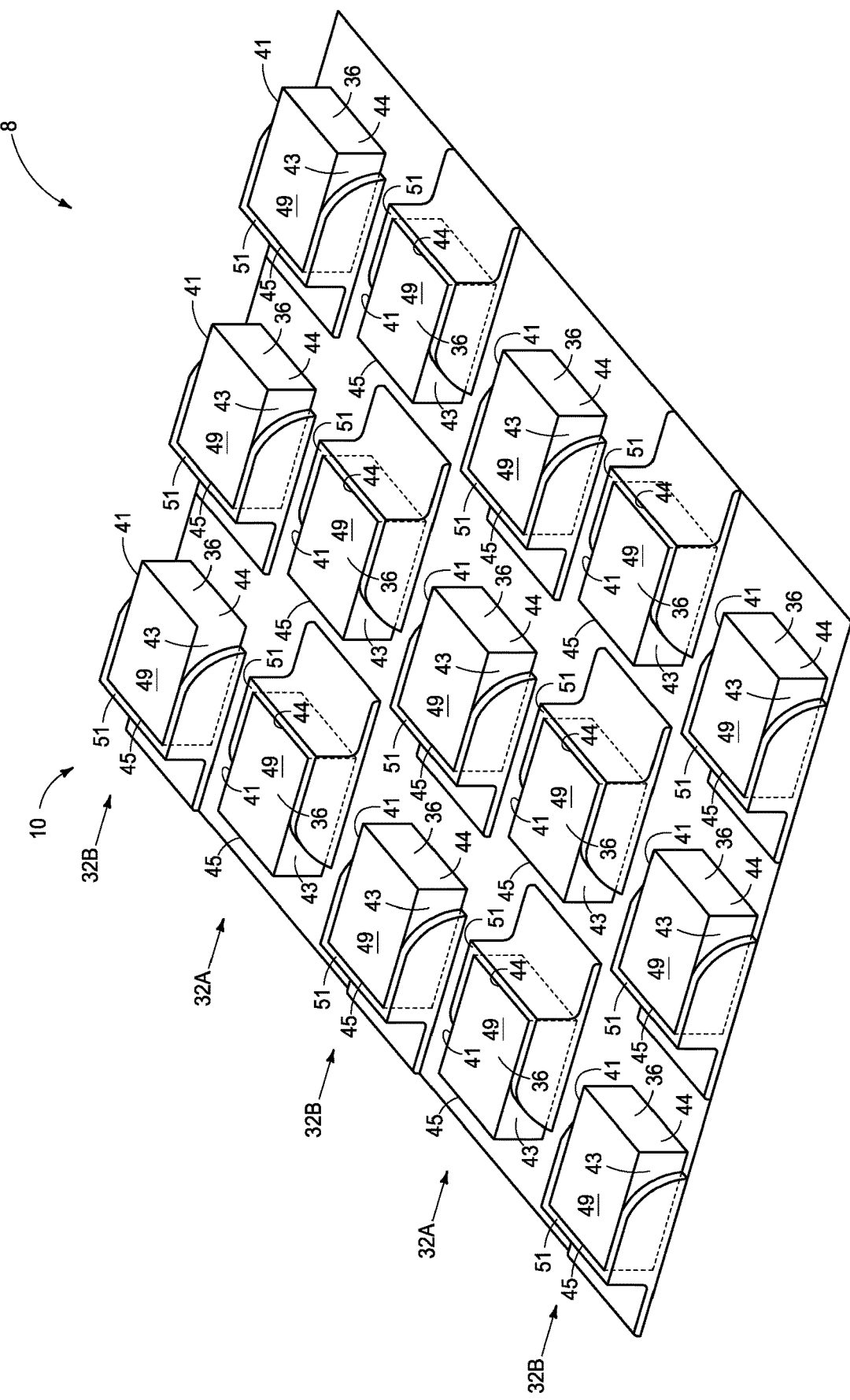
FIG. 17 is a view of the FIG. 16 construction at a processing step subsequent to that shown by FIG. 16.
Figure 18:
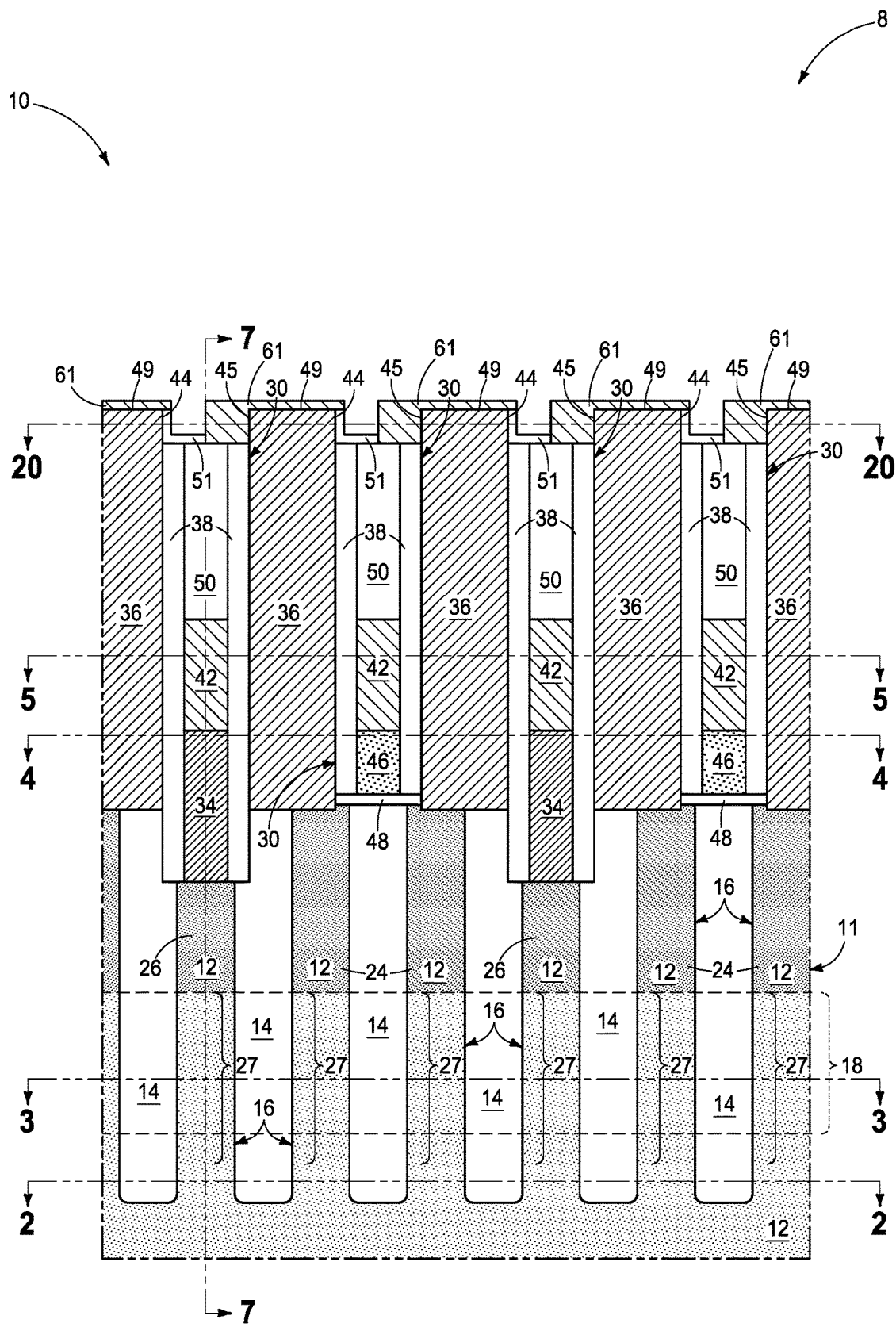
FIG. 18 is a view of the FIG. 17 construction at a processing step subsequent to that shown by FIG. 17 and is taken through line 17-17 in FIG. 19.
Figure 19:
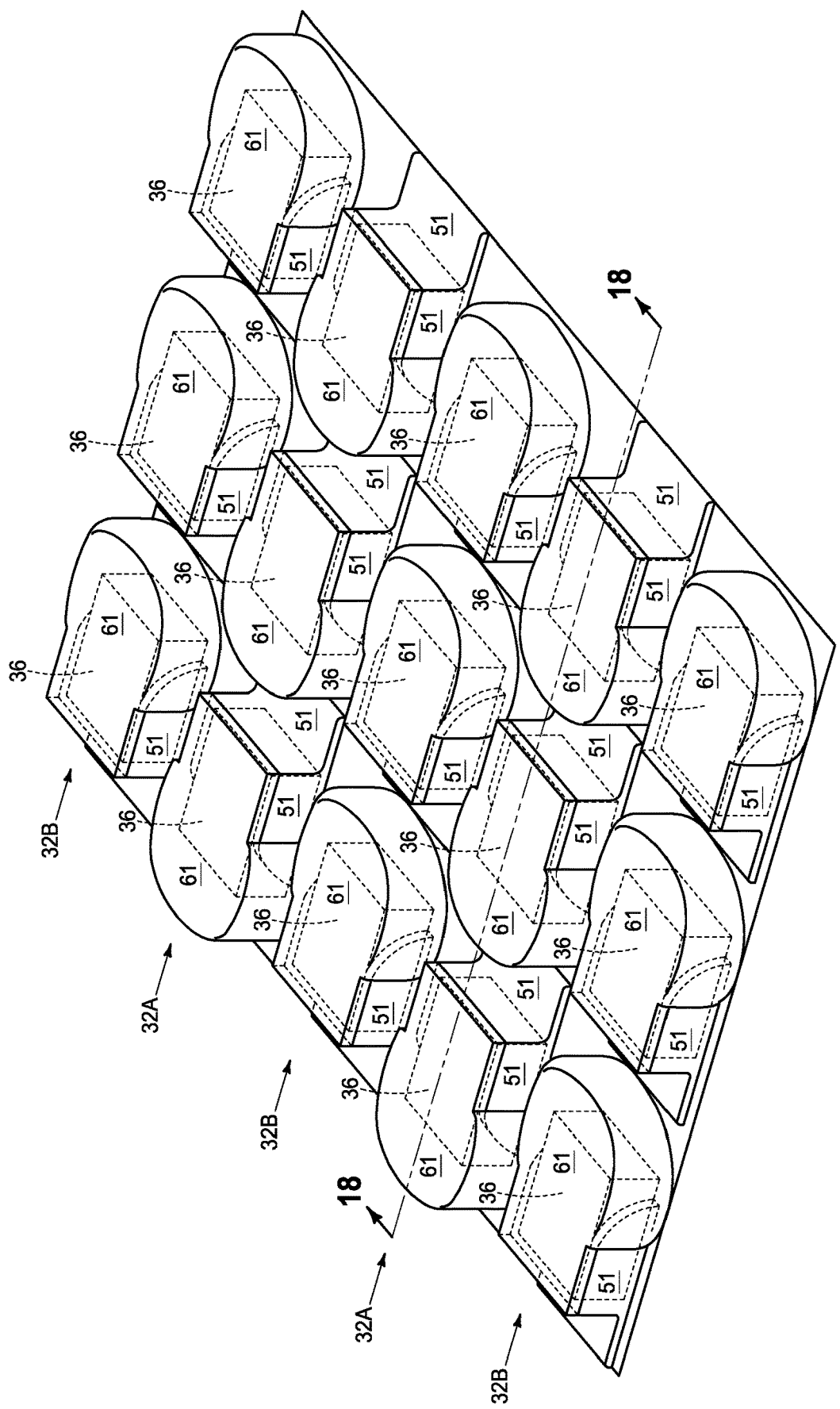
FIG. 19 is a perspective view of a portion of FIG. 18.

Referring to FIG. 17, masking material 59 (not shown) has been removed whereby first and second series of rows 32A and 32B, respectively, are no longer masked (they are exposed).

Referring to FIGS. 18, 19, 20, and 20A, conductive material 61 has been selectively deposited onto exposed first upper end-walls 44 of individual conductive vias 36 in second series of rows 32B relative to covering material 51 that covers second upper end-walls 45 of individual conductive vias 36 in second series of rows 32B. Further, such selectively depositing of conductive material 61 has also occurred onto exposed second upper end-walls 45 of individual conductive vias 36 in first series of rows 32A relative to covering material 51 that covers first upper end-walls 44 of individual conductive vias 36 in first series of rows 32A. Conductive material 61 may be of the same or different composition from that of conductive vias 36. In one embodiment, conductive material 61 comprises metal material (e.g., W, Co, Mo, silicide, etc.). The artisan is capable of selecting any existing or future-developed technique for such selective deposition. For example, and by way of example only, Co can be CVD-deposited onto Cu and other metals selectively relative to silicon dioxide and silicon nitride using an organometallic or metal-organic (e.g., repeated cycles of exposure to cobalt carbonyl cyclopentadiene at 210° C. with intermittent NH₃ plasma treatment of the selectively deposited Co). Alternately, and again by way of example only, metal can be deposited electrolessly selectively relative to silicon dioxide and silicon nitride by contacting the outer substrate surface with a solution (e.g., substrate immersed in a bath or by a spin-on method) containing a metal salt (e.g., cobalt, nickel, or tungsten sulfate) and a reducing agent (e.g., a hypophosphite salt or dimethylamine borane).

In one embodiment and as shown, at least some of opposing sidewalls 41 and 43 are masked by covering material 51 during such selective depositing, and whereby those portions of sidewalls 41 and 43 that are exposed at the start of the selective depositing results in conductive material 61 also being selectively deposited onto those portions of sidewalls 41 and 43 that are exposed. Further and regardless, in one embodiment, at least some of tops 49, and all of tops 49 as shown, is exposed at the start of the selectively depositing whereby conductive material 61 is also deposited onto at least some or all of tops 49 at the start of the selectively depositing.

Figure 21:
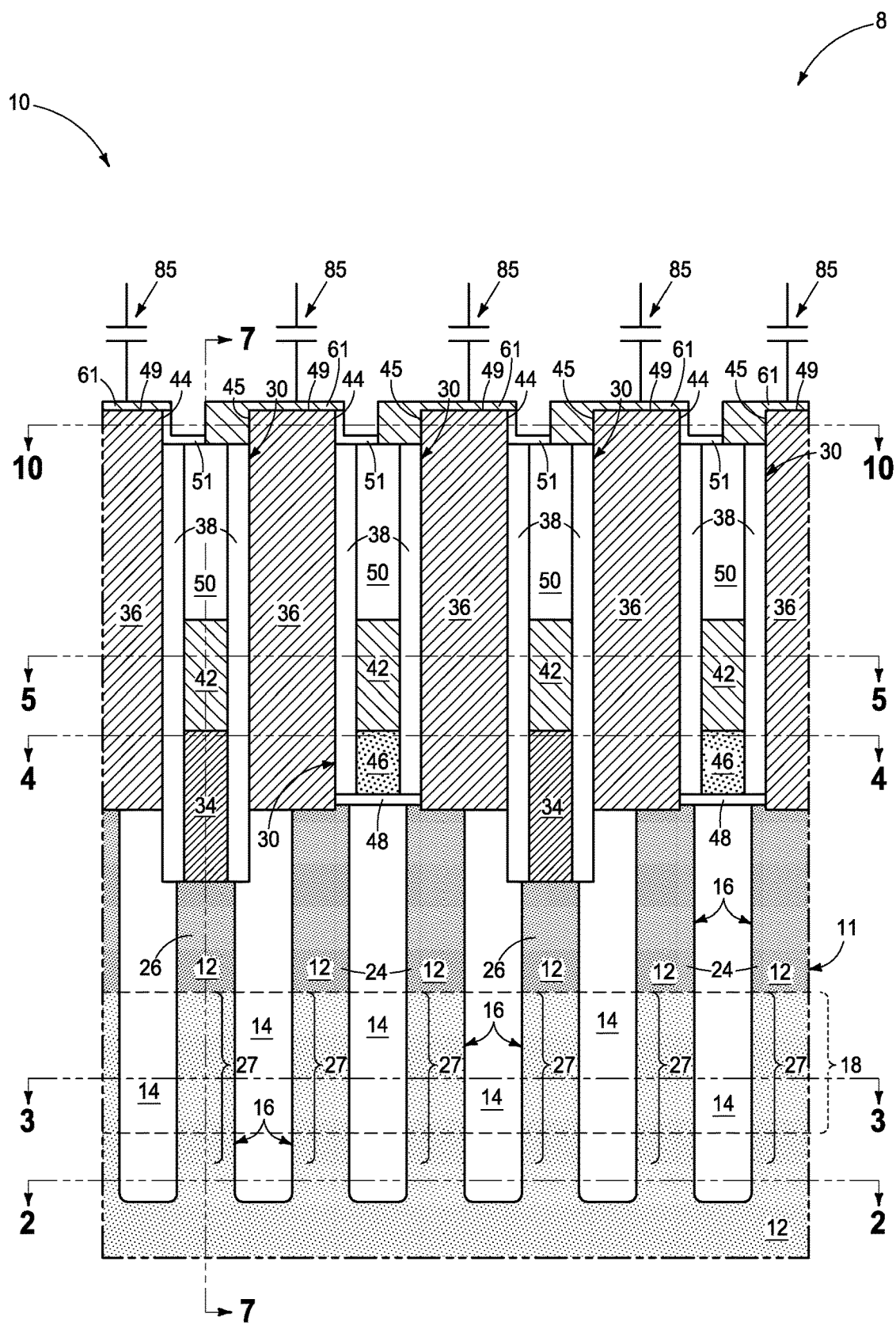
FIG. 21 is a hybrid structure and schematic view of the FIG. 18 construction at a processing step subsequent to that shown by FIG. 18.
Figure 22:
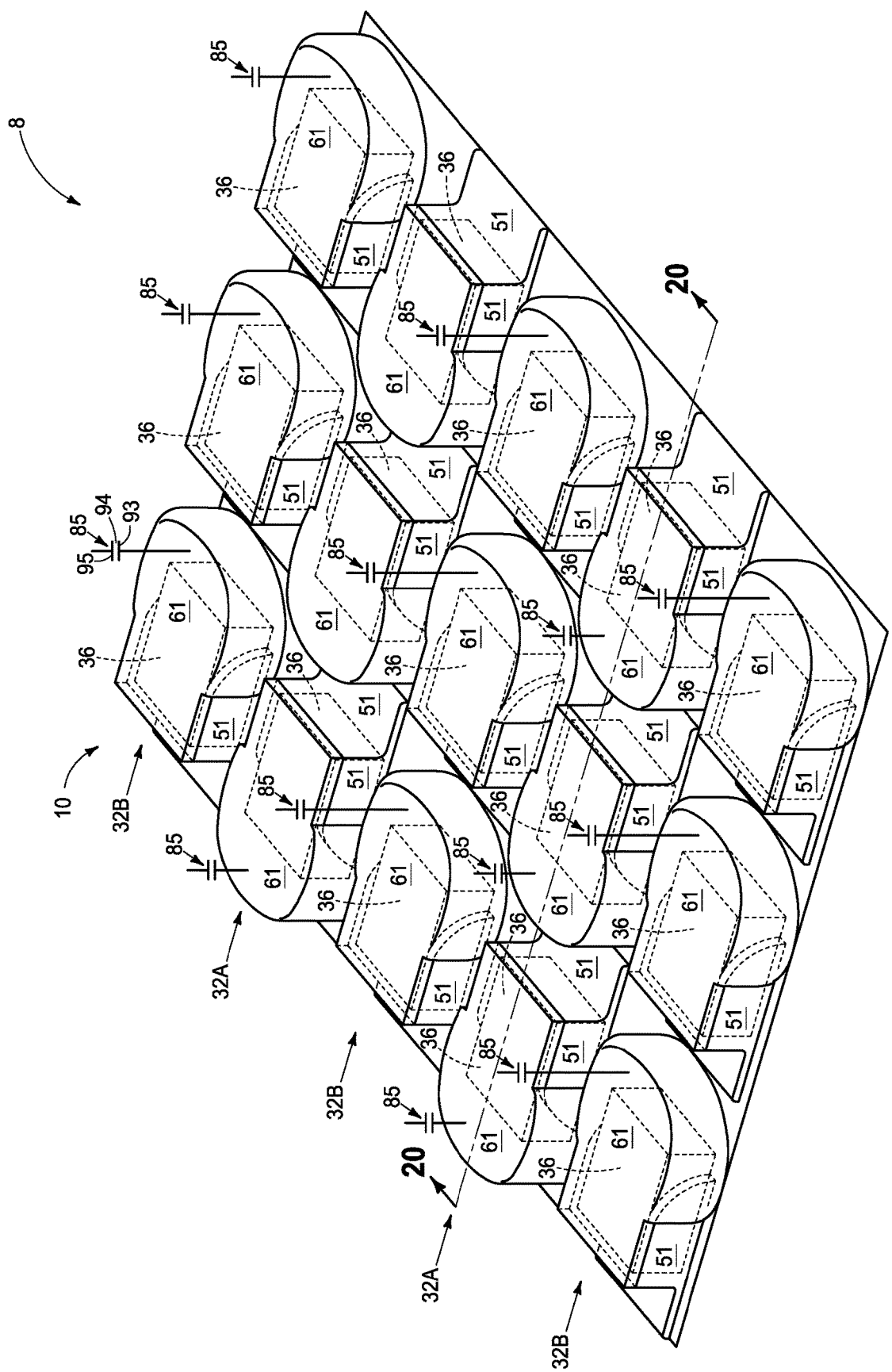
FIG. 22 is a hybrid structure and schematic perspective view of a portion of FIG. 21.

Referring to FIGS. 21 and 22, a plurality of capacitors 85 have been formed which individually comprise a lower conductive electrode 93, an upper conductive electrode 95, and a capacitor insulator 94 there-between. Individual lower capacitor electrodes 93 electrically couple, in one embodiment directly electrically couple, to selectively-deposited conductive material 61 of individual conductive vias 36.

Conductive material 61 in some embodiments may be considered as a redistribution layer (RDL) (i.e., an upper layer of integrated circuitry that comprises metal material and that makes input/output nodes for the integrated circuitry available in or at other locations). Forming RDL material as described above may reduce tendency of undesired shorting of immediately laterally and/or transversely-spaced masses of RDL material as occurs in prior art processes. Further and regardless, conductive material 61 may be considered as effectively comprising part of individual conductive vias 36 and/or forming individual conductive vias 36/61. Any other attribute(s) or aspect(s) as shown and/or described herein with respect to other embodiments may be used.

Figure 20:
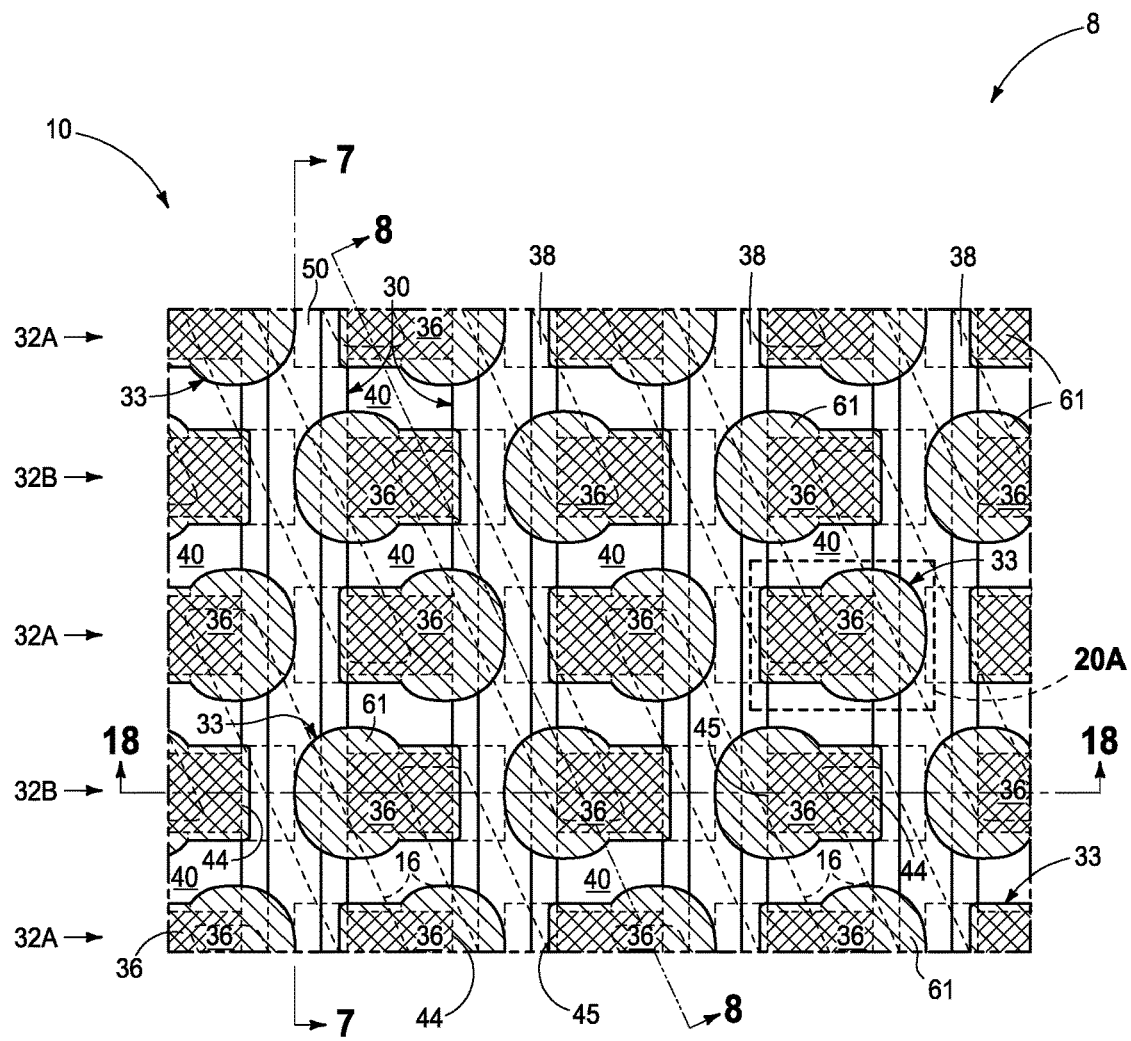
FIG. 20 is a view taken through line 20-20 in FIG. 18.
Figure 20A:
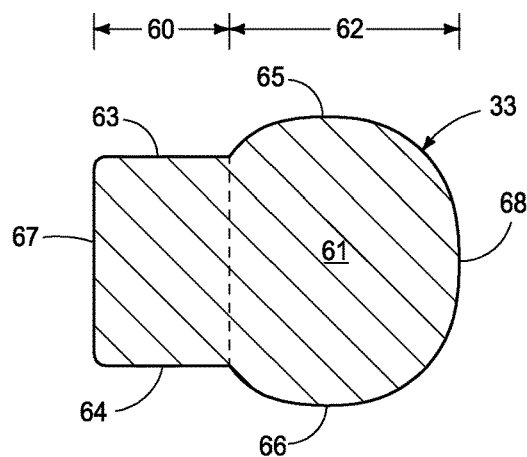
FIG. 20A is an enlarged view of a portion of FIG. 20.

In one embodiment, individual conductive vias 36/61 comprise an upper (in one embodiment an uppermost) horizontal perimeter 33 (FIGS. 20 and 20A) comprising opposing end portions 60 and 62 (FIG. 20A). One of the opposing end portions (e.g., 60) comprises opposing straight sidewalls 63 and 64. The other of the opposing end portions (e.g., 62) comprises opposing curved sidewalls 65 and 66 that join with opposing straight sidewalls 63 and 64 of opposing end portions 60. In one embodiment, opposing straight sidewalls 63 and 64 are parallel one another. In one embodiment, opposing end portion 60 has a straight end-wall 67 that joins with opposing straight sidewalls 63 and 64. In one embodiment, other opposing end portion 62 has a curved end-wall 68 that joins with opposing curved sidewalls 65 and 66. In one embodiment, opposing end portion 60 of upper horizontal perimeter 33 is rectangular. In one embodiment, curved sidewalls 65 and 66 are continuously curved everywhere between where joining with opposing straight sidewalls 63 and 64 (e.g., around or by curved end wall 68). Any other attribute(s) or aspect(s) as shown and/or described herein with respect to other embodiments may be used.

An embodiment of the invention comprises a method of forming an array (e.g., 10) regardless of whether comprising part of memory circuitry and if comprising memory circuitry regardless of whether comprising DRAM. Such a method comprises forming rows (e.g., 32*) of conductive vias (e.g., 36) over a substrate (e.g., 11). The rows comprise a first series of rows (e.g., 32A) and a second series of rows (e.g., 32B). Individual of the vias comprise first and second opposing upper end-walls (e.g., 44 and 45, respectively). Conductive material (e.g., 61) is selectively deposited onto the first upper end-walls of the individual vias in the second series of rows relative to the second upper end-walls of the individual vias in the second series of rows. Such conductive material 61 is also selectively deposited onto the second upper end-walls of the individual vias in the first series of rows relative to the first upper end-walls of the individual vias in the first series of rows. In one embodiment, a plurality of capacitors (e.g., 85) is formed, and individually comprise a lower conductive electrode (e.g., 93), an upper conductive electrode (e.g., 95), and a capacitor insulator (e.g., 94) there-between. Individual of the lower conductive electrodes are electrically coupled, in one embodiment directly electrically coupled, to the selectively deposited conductive material of the individual vias. In one embodiment, the second upper end-walls of the individual vias in the second series of rows and the first upper end-walls of the individual vias in the first series of rows are masked during such selectively depositing. In one embodiment, such masking may be conducted by a masking material (e.g., covering material 51) whereby such selectively depositing of conductive material 61 occurs relative to one of opposing upper end-walls due to such opposing upper end-wall being masked. Alternately, and by way of example only, such opposite end-wall may not be masked (not shown) and the act of selective depositing relative to the different end-walls occurring by such end-walls having different conductive compositions relative one another. Any other attribute(s) or aspect(s) as shown and/or described herein with respect to other embodiments may be used.

Figure 23:
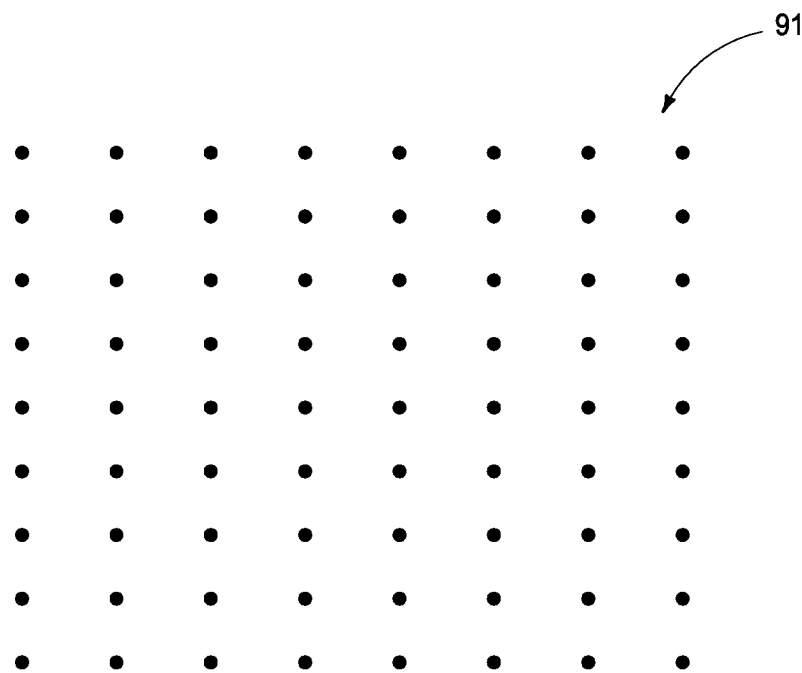
FIG. 23 is a diagrammatic view of a 2D lattice configuration.
Figure 24:
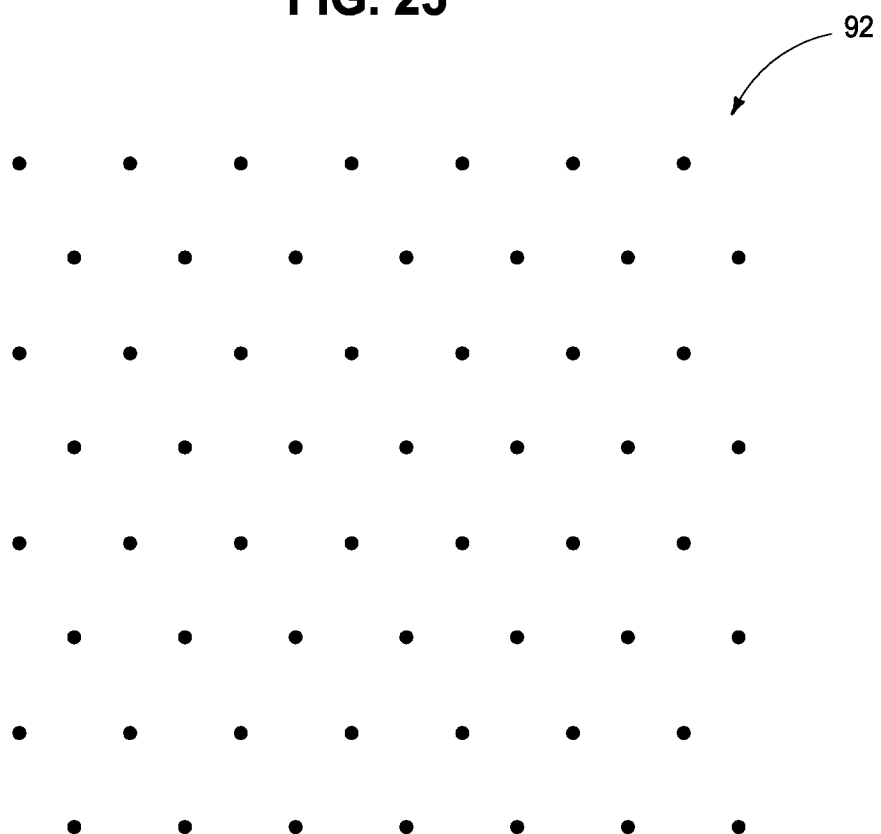
FIG. 24 is a diagrammatic view of a 2D lattice configuration.

An embodiment of the invention comprises a method used in the fabrication of integrated circuitry (i.e., whether existing or future-developed, and regardless of whether comprising memory circuitry). Such a method comprises forming an array (e.g., 10) of conductive vias (e.g., 36) in a first 2D horizontal lattice configuration. For example, FIG. 23 diagrammatically translates or reduces a 2D horizontal lattice configuration as may occur from a construction like that of FIG. 10 to small dots as shown, and as is shown as an example horizontal lattice configuration 91. The array comprises a first series of rows (e.g., 32A) of the individual vias and a second series of rows (e.g., 32B) of the individual vias. The individual vias comprise first and second opposing upper end-walls (e.g., 44 and 45 in FIG. 10). Conductive material (e.g., 61) is selectively deposited onto the first upper end-walls of the individual vias in the second series of rows relative to the second upper end-walls of the individual vias in the second series of rows. Further, the conductive material is selectively deposited onto the second upper end-walls of the individual vias in the first series of rows relative to the first upper end-walls of the individual vias in the first series of rows. The act of selectively depositing forms a second 2D horizontal lattice configuration 92 (FIG. 24) of the conductive material that is different from that of the first 2D horizontal lattice configuration. In one embodiment, the first and second 2D horizontal lattice configurations are individually different ones of oblique, rectangular, square, centered rectangular, and hexagonal. Example horizontal lattice configuration 91 is rectangular, and example horizontal lattice configuration 92 is hexagonal. In one embodiment and as shown, the first 2D lattice configuration is one of rectangular or square and the second 2D lattice configuration is hexagonal. Regardless, the first and second 2D horizontal lattice configurations may or may not individually constitute a. Bravais lattice. Any other attribute(s) or aspect(s) as shown and/or described herein with respect to other embodiments may be used.

An embodiment of the invention encompasses integrated circuitry comprising an array independent of method of manufacture, yet which may be manufactured as described above and regardless may comprise any of the above-described attributes. Such integrated circuitry comprises conductive vias (e.g., 36/61). The individual conductive vias comprise an upper horizontal perimeter (e.g., 33) comprising opposing end portions (e.g., 60, 62). One of the opposing end portions (e.g., 60) comprises opposing straight sidewalls (e.g., 63, 64) and the other of the opposing end portions (e.g., 62) comprises opposing curved sidewalls (e.g., 65, 66) that join with the opposing straight sidewalls of the one opposing end portion. Any other attribute(s) or aspect(s) as shown and/or described herein with respect to other embodiments may be used.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends devotionally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming an array comprises forming rows of conductive vias over a substrate. The rows comprise a first series of the rows and a second series of the rows. Individual of the vias comprise first and second opposing upper end-walls. Conductive material is selectively deposited onto the first upper end-walls of the individual vias in the second series of the rows relative to the second upper end-walls of the individual vias in the second series of the rows, and onto the second upper end-walls of the individual vias in the first series of the rows relative to the first upper end-walls of the individual vias in the first series of the rows.

In some embodiments, a method of forming an array comprises forming rows of conductive vias over a substrate. Individual of the vias comprise first and second opposing upper end-walls. The first and second upper end-walls are covered with covering material. A first series of the rows is masked to leave a second series of the rows unmasked. The covering material is removed from and to expose the first upper end-walls in the unmasked second series of the rows. The second series of the rows is masked to leave the first series of the rows unmasked. The covering material is removed from and to expose the second upper end-walls in the unmasked first series of the rows. While the first and second series of rows are exposed, conductive material is selectively deposited onto the exposed first upper end-walls of the individual vias in the second series of the rows relative to the covering material that covers the second upper end-walls of the individual vias in the second series of the rows, and onto the exposed second upper end-walls of the individual vias in the first series of the rows relative to the covering material that covers the first upper end-walls of the individual vias in the first series of the rows.

In some embodiments, a method of forming DRAM circuitry comprises providing a substrate comprising pairs of recessed access devices. The recessed access devices individually comprise a conductive gate in a trench in semiconductive material. A gate insulator is along sidewalls and a base of the trench between the conductive gate and the semiconductive material. A pair of source/drain regions is in upper portions of the semiconductive material on opposing sides of the trench. A channel region is in the semiconductive material below the pair of source/drain regions along the trench sidewalls and around the trench base. One of the source/drain regions of the pair of source/drain regions in individual of the pairs of recessed access devices is laterally between the conductive gates in and being shared by the individual pairs of recessed access devices. The others of the source/drain regions of the pair of source/drain regions are not shared in the individual pairs of recessed access devices. Digitline structures are formed that are individually directly electrically coupled to the one shared source/drain region of multiple of the individual pairs of recessed access devices. Conductive vias are formed laterally between and spaced longitudinally along the digitline structures. Individual of the vias comprise a first series of rows and a second series of rows. The individual vias comprise first and second opposing upper end-walls. The individual vias are directly electrically coupled to one of the other source/drain regions in the individual pairs of recessed access devices. Conductive material is selectively deposited onto the first upper end-walls of the individual vias in the second series of rows relative to the second upper end-walls of the individual vias in the second series of rows, and onto the second upper end-walls of the individual vias in the first series of rows relative to the first upper end-walls of the individual vias in the first series of rows. A plurality of capacitors is formed, and that individually comprise a lower conductive electrode, an upper conductive electrode, and a capacitor insulator there-between. Individual of the lower conductive electrodes are electrically coupled to the selectively-deposited conductive material of the individual vias.

In some embodiments, a method used in the fabrication of integrated circuitry comprises forming an array of conductive vias in a first 2D horizontal lattice configuration. The array comprises a first series of rows of individual of the vias and a second series of rows of the individual vias. The individual vias comprise first and second opposing upper end-walls. Conductive material is selectively deposited onto the first upper end-walls of the individual vias in the second series of rows relative to the second upper end-walls of the individual vias in the second series of rows, and onto the second upper end-walls of the individual vias in the first series of rows relative to the first upper end-walls of the individual vias in the first series of rows. The selectively depositing forms a second 2D horizontal lattice configuration of the conductive material that is different from that of the first 2D horizontal lattice configuration.

In some embodiments, integrated circuitry comprising an array comprises a plurality of conductive vias. Individual of the vias comprise an upper horizontal perimeter comprising opposing end portions. One of the opposing end portions comprises opposing straight sidewalls. The other of the opposing end portions comprises opposing curved sidewalls that join with the opposing straight sidewalls of the one opposing end portion.

In some embodiments, integrated circuitry comprising an array of capacitors comprises conductive vias. A plurality of capacitors individually comprise a lower conductive electrode, an upper conductive electrode, and a capacitor insulator there-between. Individual of the lower conductive electrodes are electrically coupled to individual of the vias. The individual vias comprise an upper horizontal perimeter comprising opposing end portions. One of the opposing end portions comprises opposing straight sidewalls. The other of the opposing end portions comprises opposing curved sidewalls that join with the opposing straight sidewalls of the one opposing end portion.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array, comprising:
forming rows of conductive vias over a substrate, the rows comprising a first series of the rows and a second series of the rows, individual of the conductive vias comprising first and second opposing upper end-walls; and
selectively depositing a conductive material onto:
the first upper end-walls of the individual conductive vias in the second series of the rows relative to the second upper end-walls of the individual conductive vias in the second series of the rows; and
the second upper end-walls of the individual conductive vias in the first series of the rows relative to the first upper end-walls of the individual conductive vias in the first series of the rows.

2. The method of claim 1 wherein the second upper end-walls of the individual conductive vias in the second series of the rows and the first upper end-walls of the individual conductive vias in the first series of the rows are masked during said selectively depositing whereby the conductive material is not deposited over said second upper end-walls of the individual conductive vias in the second series of the rows and whereby the conductive material is not deposited over said first upper end-walls of the individual conductive vias in the first series of the rows.

3. The method of claim 1 wherein the individual conductive vias comprise opposing sidewalls, at least some of the sidewalls being masked during said selectively depositing.

4. The method of claim 3 wherein only some of the sidewalls are masked during said selectively depositing, another some of the sidewalls being exposed at a start of said selectively depositing and the conductive material being selectively deposited onto the another some of the sidewalls that are exposed at the start of said selectively depositing.

5. The method of claim 1 wherein the conductive vias individually comprise a top, at least some of the top being exposed at a start of said selectively depositing and the conductive material being selectively deposited onto at least some of the top at the start of the selectively depositing.

6. The method of claim 5 wherein all of the top is exposed at the start of the selectively depositing and the conductive material being selectively deposited onto all of the top at the start of the selectively depositing.

7. The method of claim 1 wherein the first series of the rows individually alternate every-other-one with the second series of the rows.

8. The method of claim 1 comprising forming a plurality of capacitors individually comprising a lower conductive electrode, an upper conductive electrode, and a capacitor insulator there-between; individual of the lower conductive electrodes being electrically coupled to the selectively-deposited conductive material of the individual conductive vias.

9. The method of claim 8 comprising forming the array of capacitors and the conductive vias as a part of a memory circuitry.

10. The method of claim 9 wherein the memory circuitry comprises a DRAM comprising individual memory cells having a transistor and one of the plurality of capacitors.

11. A method of forming an array, comprising:
forming rows of conductive vias over a substrate, individual of the conductive vias comprising first and second opposing upper end-walls;
covering the first and second upper end-walls with a covering material;
masking a first series of the rows with a first mask on the substrate to leave a second series of the rows unmasked;
removing the covering material from and to expose the first upper end-walls in the unmasked second series of the rows while the first series of the rows is masked with the first mask;
after removing the covering material from and to expose the first upper end-walls in the unmasked second series of the rows, removing the first mask and masking the second series of the rows with a second mask on the substrate to leave the first series of the rows unmasked;

removing the covering material from and to expose the second upper end-walls in the unmasked first series of the rows while the second series of the rows is masked with the second mask;

after removing the covering material from and to expose the second upper end-walls in the unmasked first series of the rows, removing the second mask; and after removing the first mask and the second mask and while the first and second series of the rows are exposed, selectively depositing a conductive material onto:

the exposed first upper end-walls of the individual conductive vias in the second series of the rows relative to the covering material that covers the second upper end-walls of the individual conductive vias in the second series of the rows; and the exposed second upper end-walls of the individual conductive vias in the first series of the rows relative to the covering material that covers the first upper end-walls of the individual conductive vias in the first series of the rows.

12. The method of claim 11 wherein, the removing of the covering material from and to expose the first upper end-walls in the unmasked second series of the rows comprises anisotropically directionally etching of the said covering material that is over said first upper end-walls at a first angle on a first side of perpendicular to a mean global outer horizontal surface of the substrate; and the removing of the covering material from and to expose the second upper end-walls in the unmasked first series of the rows comprises anisotropically directionally etching of the said covering material that is over said second upper end-walls at a second angle from a second side opposite the first side of perpendicular to the mean global outer horizontal surface of the substrate.

13. The method of claim 12 wherein the first and second angles are of the same value but in different directions.

14. The method of claim 11 comprising forming the individual conductive vias to comprise a top, the conductive material being selectively deposited onto the top at a start of said first-stated selectively depositing of the conductive material.

15. The method of claim 11 comprising forming the individual conductive vias to have a top and covering the top with the covering material, the covering material covering the top being removed during the removing of the covering material from the first upper end-walls in the unmasked second series of the rows and exposing the top, the conductive material being selectively deposited onto the top at a start of said first-stated selectively depositing of the conductive material.

16. The method of claim 11 wherein the covering material is 100% sacrificial.

17. The method of claim 11 wherein the covering material is not 100% sacrificial.

18. The method of claim 11 wherein the covering material is conductive.

19. The method of claim 18 wherein the covering material is 100% sacrificial.

20. The method of claim 11 wherein the covering material is insulative.

21. The method of claim 11 wherein the covering material comprises polysilicon.

22. A method used in the fabrication of integrated circuitry, comprising:

forming an array of conductive vias in a first 2D horizontal lattice configuration, the array comprising a first series of rows of individual of the conductive vias and a second series of rows of the individual conductive vias, the individual vias comprising first and second opposing upper end-walls;

selectively depositing a conductive material onto:

the first upper end-walls of the individual conductive vias in the second series of rows relative to the second upper end-walls of the individual vias in the second series of rows; and the second upper end-walls of the individual conductive vias in the first series of rows relative to the first upper end-walls of the individual conductive vias in the first series of rows; and the selectively depositing forming a second 2D horizontal lattice configuration of the conductive material that is different from that of the first 2D horizontal lattice configuration.

23. The method of claim 22 wherein the first and second 2D horizontal lattice configurations are individually different ones of oblique, rectangular, square, centered rectangular, and hexagonal.

24. The method of claim 22 wherein the first 2D lattice configuration is one of rectangular or square and the second 2D lattice configuration is hexagonal.

25. The method of claim 22 wherein the first and second 2D horizontal lattice configurations are individually a Bravais lattice.

26. The method of claim 22 wherein the first and second 2D horizontal lattice configurations are individually not a Bravais lattice.

* * * * *